United States Patent
Nagase et al.

(10) Patent No.: US 10,164,087 B2
(45) Date of Patent: Dec. 25, 2018

(54) SEMICONDUCTOR DEVICE AND METHOD OF MANUFACTURING SAME

(71) Applicant: RENESAS ELECTRONICS CORPORATION, Tokyo (JP)

(72) Inventors: Senichirou Nagase, Ibaraki (JP); Tsuyoshi Kachi, Ibaraki (JP); Yoshinori Hoshino, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/428,350

(22) Filed: Feb. 9, 2017

(65) Prior Publication Data
US 2017/0229572 A1    Aug. 10, 2017

(30) Foreign Application Priority Data
Feb. 10, 2016  (JP) .................. 2016-023767

(51) Int. Cl.
| | |
|---|---|
| *H01L 29/78* | (2006.01) |
| *H01L 29/06* | (2006.01) |
| *H01L 29/10* | (2006.01) |
| *H01L 29/40* | (2006.01) |
| *H01L 29/66* | (2006.01) |
| *H01L 21/265* | (2006.01) |

(52) U.S. Cl.
CPC ...... *H01L 29/7811* (2013.01); *H01L 29/0634* (2013.01); *H01L 29/1095* (2013.01); *H01L 29/401* (2013.01); *H01L 29/404* (2013.01); *H01L 29/407* (2013.01); *H01L 29/408* (2013.01); *H01L 29/66734* (2013.01); *H01L 29/7813* (2013.01); *H01L 21/26513* (2013.01); *H01L 21/26586* (2013.01)

(58) Field of Classification Search
CPC ............. H01L 29/7811; H01L 29/0634; H01L 29/1095; H01L 29/401; H01L 29/404; H01L 29/407; H01L 29/408; H01L 29/66734; H01L 29/7813
See application file for complete search history.

(56) References Cited

U.S. PATENT DOCUMENTS

| | | | |
|---|---|---|---|
| 6,509,240 B2 * | 1/2003 | Ren ...................... | H01L 29/7802 438/302 |
| 7,605,427 B2 * | 10/2009 | Hirler ................... | H01L 29/407 257/331 |
| 8,013,391 B2 * | 9/2011 | Yedinak .............. | H01L 21/3065 257/340 |

(Continued)

FOREIGN PATENT DOCUMENTS

JP        5612268 B2    10/2014

*Primary Examiner* — Jarrett Stark
*Assistant Examiner* — Charles N Ausar-El
(74) *Attorney, Agent, or Firm* — McDermott Will & Emery LLP

(57) ABSTRACT

To provide a semiconductor device equipped with a snubber portion having an improved withstand voltage and capable of reducing a surge voltage at turn-off of an insulated gate field effect transistor portion. The concentration of a first conductivity type impurity in a snubber semiconductor region is greater than that in a drift layer. The thickness of a snubber insulating film between the snubber semiconductor region and a snubber electrode is greater than that of a gate insulating film between a gate electrode and a body region.

10 Claims, 21 Drawing Sheets

(56) References Cited

U.S. PATENT DOCUMENTS

| | | | |
|---|---|---|---|
| 8,410,546 B2 | 4/2013 | Kawaguchi et al. | |
| 8,570,780 B2 * | 10/2013 | Godo | H01L 27/0688 361/91.7 |
| 8,643,071 B2 * | 2/2014 | Pan | H01L 29/7803 257/288 |
| 9,627,328 B2 * | 4/2017 | Kelkar | H01L 29/407 |
| 2007/0274014 A1 * | 11/2007 | Berberich | H01L 23/642 361/91.7 |
| 2009/0114985 A1 * | 5/2009 | Akagi | H01L 27/0921 257/334 |
| 2009/0159963 A1 * | 6/2009 | Yamaguchi | H01L 29/7813 257/328 |
| 2010/0163950 A1 * | 7/2010 | Gladish | H01L 29/66181 257/302 |
| 2011/0042727 A1 * | 2/2011 | Pan | H01L 29/0865 257/281 |
| 2012/0007178 A1 * | 1/2012 | Oota | H01L 23/562 257/334 |
| 2016/0104766 A1 * | 4/2016 | Kelkar | H01L 29/0623 257/328 |
| 2016/0104773 A1 * | 4/2016 | Kelkar | H01L 29/407 257/334 |
| 2016/0111419 A1 * | 4/2016 | Naito | H01L 27/0716 257/140 |
| 2017/0186861 A1 * | 6/2017 | Kelkar | H01L 29/7803 |
| 2017/0287903 A1 * | 10/2017 | Lui | H01L 27/0629 |

* cited by examiner

SEMICONDUCTOR DEVICE AND METHOD OF MANUFACTURING SAME

CROSS-REFERENCE TO RELATED APPLICATIONS

The disclosure of Japanese Patent Application No. 2016-023767 filed on Feb. 10, 2016 including the specification, drawings, and abstract is incorporated herein by reference in its entirety.

BACKGROUND

The present invention relates to a semiconductor device and a method of manufacturing same.

Semiconductor devices equipped with an insulated gate field effect transistor portion such as power MOSFET (metal oxide semiconductor field effect transistor) and a snubber portion are known (refer to Patent Documents 1 and 2). When then insulated gate field effect transistor portion is used as a high-speed switching element, a surge voltage may occur between a source electrode and a drain electrode at turn-off. The surge voltage exceeding the withstand voltage of the insulated gate field effect transistor portion destroys the insulated gate field effect transistor portion. A snubber circuit between the source electrode and the drain electrode can reduce this surge voltage and thereby suppress the insulated gate field effect transistor portion from being destroyed.

A capacitor in a snubber portion of a semiconductor device disclosed in Patent Document 1 includes an $n^-$ type epitaxial layer, a trench source electrode, and a capacitive insulating film between the $n^-$ type epitaxial layer and the trench source electrode. The $n^-$ type epitaxial layer is coupled to a drain electrode. The capacitive insulating film and the trench source electrode are provided in a trench formed in the $n^-$ type epitaxial layer.

A capacitor in a snubber portion of a semiconductor device disclosed in Patent Document 2 includes an $n^-$ type drift layer, a p type body layer on the $n^-$ type drift layer, a snubber electrode, and an insulating film between the $n^-$ type drift layer and the snubber electrode. The $n^-$ type drift layer is coupled to a drain electrode. The $n^-$ type drift layer functions as a drift layer in an insulated gate field effect transistor portion. The insulating film and the snubber electrode are provided in a trench formed in the $n^-$ type drift layer and the p type body layer.

PATENT DOCUMENTS

[Patent Document 1] Japanese Patent No. 5612268
[Patent Document 2] U.S. Pat. No. 8,643,071

SUMMARY

In Patent Document 1, in order to provide a snubber portion having an improved withstand voltage as high as the withstand voltage of an insulated gate field effect transistor portion, depletion of not only an $n^-$ type epitaxial layer on the side surface of a trench but also the $n^-$ type epitaxial layer of the snubber portion located below the trench is required. The concentration of an n type impurity concentration in the $n^-$ type epitaxial layer of the snubber portion located below the trench should be set at not greater than the concentration of an n type impurity in the $n^-$ type epitaxial layer of the insulated gate field effect transistor portion functioning as a drift layer.

A decrease in the concentration of an n type impurity in the $n^-$ type epitaxial layer of the snubber portion located below the trench leads to formation of a depletion region in the snubber portion. Due to this depletion region, a depletion region capacitor is formed in the snubber portion. The capacitor in the snubber portion therefore includes an insulating film capacitor comprised of an $n^-$ type drift layer, a snubber electrode, and an insulating film between the $n^-$ type drift layer and the snubber electrode and a depletion layer capacitor. A snubber capacity $C_{snb}$ which is a capacity of the snubber portion is represented by the following equation (1), wherein $C_{ox}$ means a capacity of the insulating film capacitor and $C_d$ means a capacity of the depletion region capacitor:

[Equation 1]

$$\frac{1}{C_{snb}} = \frac{1}{C_{ox}} + \frac{1}{C_d} \quad (1)$$

When the concentration of an n type impurity in the $n^-$ type epitaxial layer of the snubber portion is reduced in order to improve the withstand voltage in the snubber portion disclosed in Patent Document 1, the snubber capacity $C_{snb}$ decreases due to the capacity $C_d$ of the depletion region capacitor (refer to Equation (1)). The decrease in the snubber capacity $C_{snb}$ makes it difficult for the snubber portion disclosed in Patent Document 1 to reduce a surge voltage at turn-off of the insulated gate field effect transistor portion and to suppress the insulated gate field effect transistor portion from being destroyed. In particular, when the insulated gate field effect transistor portion is a power MOSFET, the $n^-$ type drift layer is thick and therefore the capacity $C_d$ of the deletion region capacitor in the snubber portion decreases further. In the power MOSFET, the snubber capacity $C_{snb}$ shows a further decrease. It therefore becomes more difficult to reduce a surge voltage and to suppress the insulated gate field effect transistor portion from being destroyed.

In Patent Document 2, not only an insulated gate field effect transistor portion but also the snubber portion has a pn junction formed by the $n^-$ type drift layer and the p type body region. The snubber portion therefore has an improved withstand voltage as high as that of the insulated gate field effect transistor portion. An insulating film contiguous to the p type body region does not contribute to the capacity $C_{ox}$ of the insulating film capacitor configuring a snubber capacity $C_{snb}$. Only an insulating film protruding from the p type body region and located between the $n^-$ type drift layer and a snubber electrode contributes to the snubber capacity $C_{snb}$. The snubber capacity $C_{snb}$ disclosed in Patent Document 2 is therefore small. It is therefore difficult for the snubber portion disclosed in Patent Document 2 to reduce a surge voltage at turn-off of the insulated gate field effect transistor portion and to suppress the insulated gate field effect transistor portion from being destroyed.

Another problem and novel features will be apparent from the description herein and accompanying drawings.

In a semiconductor device according to one embodiment, the first conductivity type impurity concentration in a snubber semiconductor region is greater than that in a drift layer. Further, in the semiconductor device according to the one embodiment, the thickness of a snubber insulating film between the snubber semiconductor region and a snubber electrode is greater than that of a gate insulating film between a gate electrode and a body region.

In a method of manufacturing a semiconductor device according to the embodiment, a snubber semiconductor region thus formed has a first conductivity type impurity concentration greater than that in a drift layer. Further, in the method of manufacturing a semiconductor device according to the embodiment, a snubber insulating film thus formed has a thickness between the snubber semiconductor region and a snubber electrode greater than the thickness of a gate insulating film between a gate electrode and a body region.

The semiconductor device and the method of manufacturing same according to the embodiment can provide a semiconductor device equipped with a snubber portion having an improved withstand voltage and capable of reducing a surge voltage at turn-off of an insulated gate field effect transistor portion and a method of manufacturing this semiconductor device.

DETAILED DESCRIPTION

Figure 1:
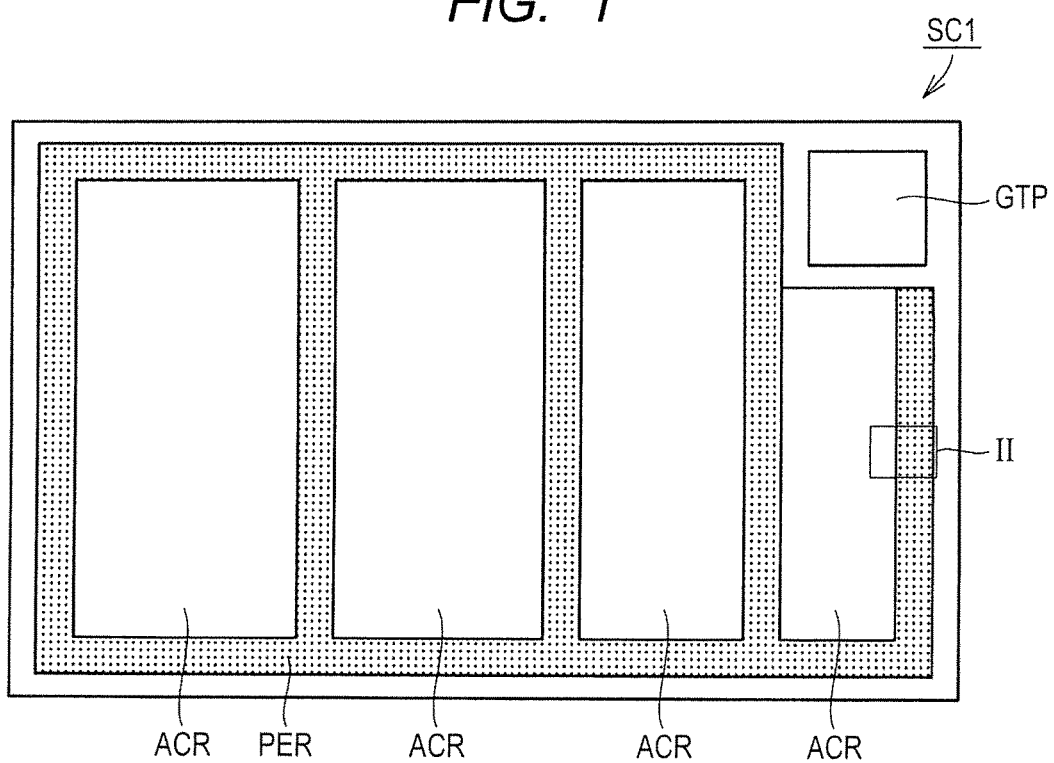
FIG. 1 is a schematic plan view of a semiconductor device according to First Embodiment.

The semiconductor device of each Embodiment will hereinafter be described. It is to be noted that the same configuration will be identified by the same reference numeral and an overlapping description will be omitted.

(First Embodiment)

Referring to FIGS. 1 to 6, a semiconductor device SC1 of the present embodiment is equipped with a semiconductor substrate SUB, an insulated gate field effect transistor portion MFT, and a snubber portion SNB.

Figure 4:
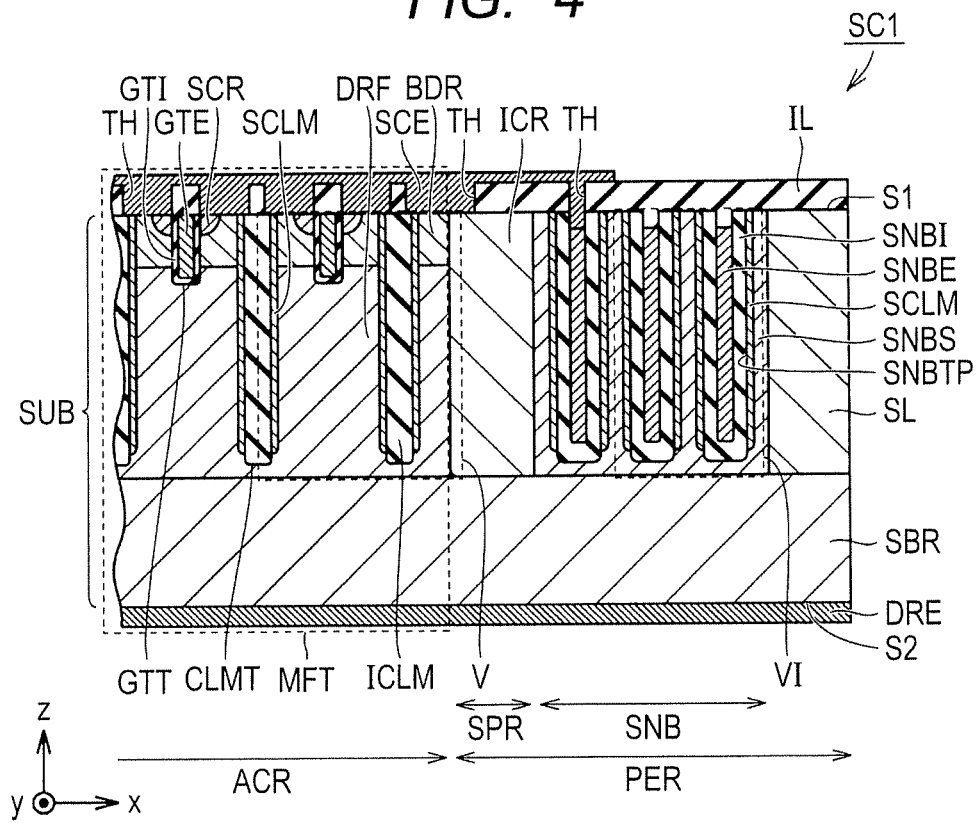
FIG. 4 is a schematic cross-sectional view taken along the section line IV-IV, shown in FIG. 2, of the semiconductor device according to First Embodiment.

Referring to FIG. 4, the semiconductor substrate SUB has a first main surface S1 and a second main surface S2 which are opposite to each other. The first main surface S1 and the second main surface S2 extend in a first direction (x direction) and a second direction (y direction) which are orthogonal to each other. The normal direction of the first main surface S1 of the semiconductor substrate SUB is a third direction (z direction). The semiconductor substrate SUB may include a substrate region SBR and a semiconductor layer SL on the substrate region SB. The semiconductor layer SL may have the first main surface S1. The substrate region SBR may have the second main surface S2. The first main surface S1 of the semiconductor layer SL may be the first main surface S1 of the semiconductor substrate SUB.

The second main surface S2 of the semiconductor layer SL may be the second main surface S2 of the semiconductor substrate SUB.

The substrate region SBR may be made of a first conductivity type semiconductor. The first conductivity type may be an $n^+$ type. The substrate region SBR may have an electrical resistivity of, for example, 5 mΩ·cm or less. The substrate region SBR may be made of, for example, an $n^+$ type single crystal silicon. The semiconductor layer SL may be a semiconductor having a second conductivity type, which is a conductivity type different from the first conductivity type, and it may contain a second conductivity type impurity. The second conductivity type may be a p type. The semiconductor layer SL may have an electrical resistivity of, for example, 1 Ω·cm or more but not more than 50 Ω·cm. The thickness of the semiconductor layer SL is determined, depending on the withstand voltage of the insulated gate field effect transistor portion MFT. The semiconductor layer SL may be, for example, a p type silicon layer. The substrate region SBR has an electrical resistivity relatively lower than that of the semiconductor layer SL. The first conductivity type impurity concentration of the substrate region SBR is relatively higher than the second conductivity type impurity concentration of the semiconductor layer SL.

The semiconductor substrate SUB has a first region ACR and a second region PER which is a region around the first region ACR. The first region ACR is an active region where the insulated gate field effect transistor portion MFT is placed. The second region PER is a peripheral region around the first region ACR. A snubber portion SNB is placed in the second region PER.

Referring to FIG. 1, the semiconductor device SC1 of the present embodiment may be equipped further with a gate pad GTP. The gate pad GTP is electrically coupled to a gate electrode GTE of the insulated gate field effect transistor portion MFT via a gate wiring GTW (refer to FIG. 2). The gate wiring GTW may be made of an aluminum (Al) film.

Figure 2:
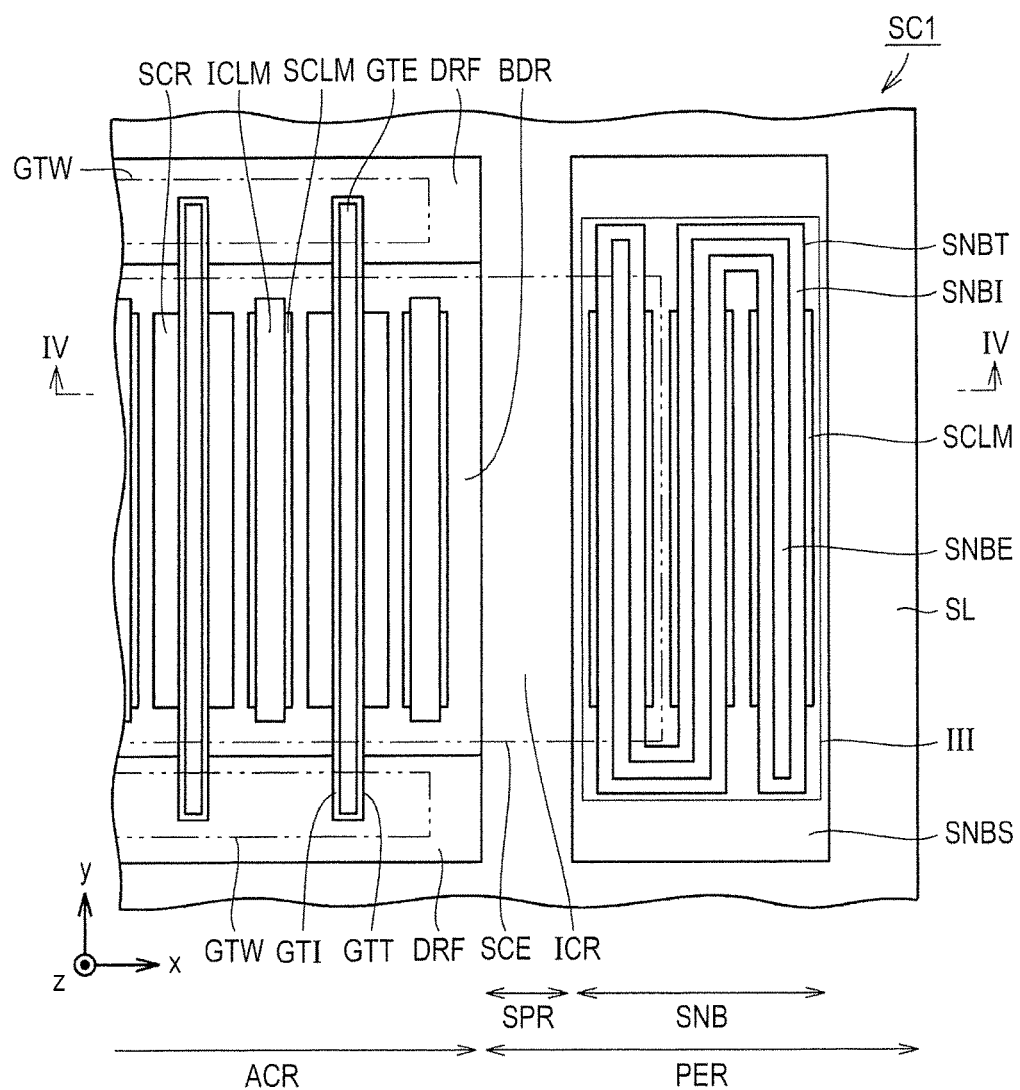
FIG. 2 is a schematic enlarged plan view of the region II, shown in FIG. 1, of the semiconductor device according to First Embodiment.
Figure 3:
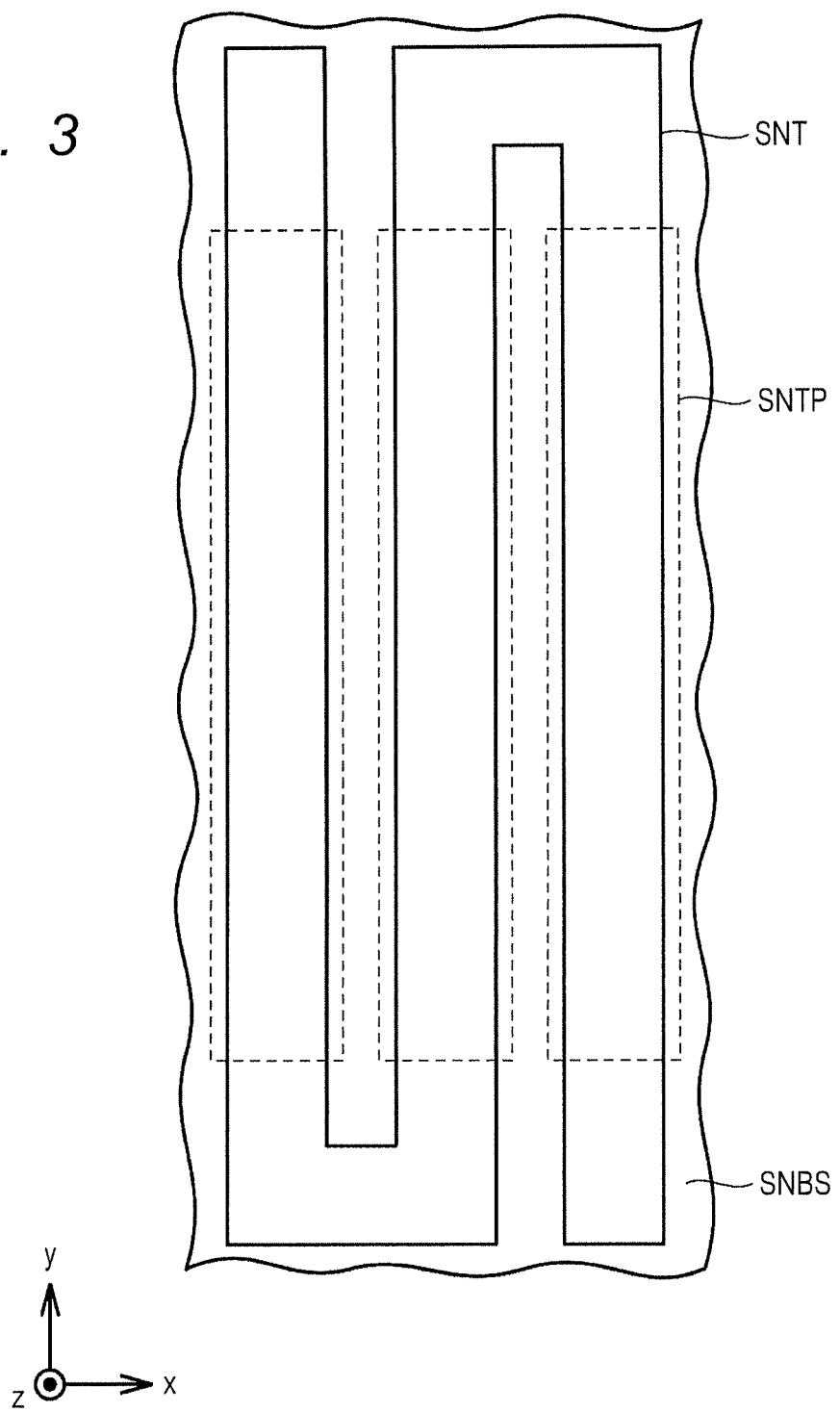
FIG. 3 is a schematic enlarged plan view of the region III, shown in FIG. 2, of the semiconductor device according to First Embodiment.
Figure 5:
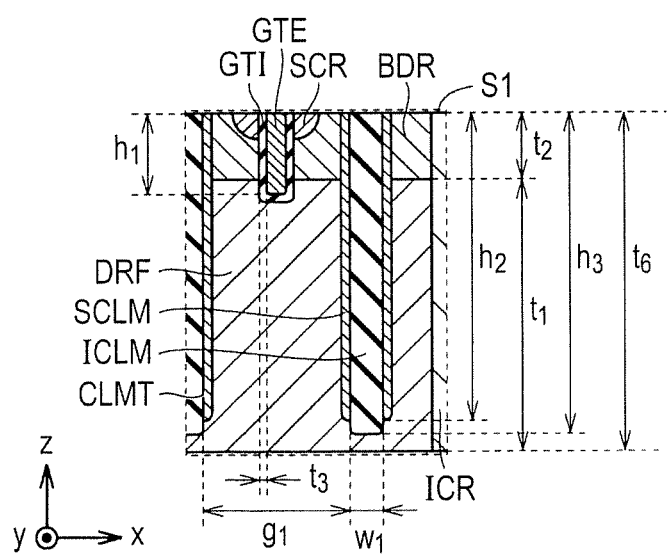
FIG. 5 is a schematic enlarged cross-sectional view of the region V, shown in FIG. 4, of the semiconductor device according to First Embodiment.
Figure 6:
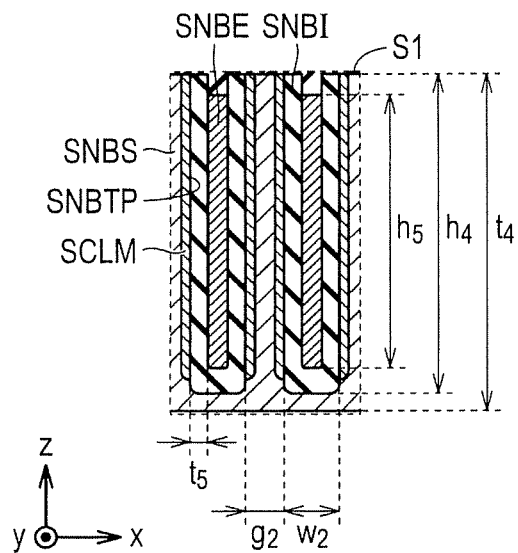
FIG. 6 is a schematic enlarged cross-sectional view of the region VI, shown in FIG. 4, of the semiconductor device according to First Embodiment.

Referring to FIGS. 2, 4, and 5, the insulated gate field effect transistor portion MFT may be a power MOS transistor portion. The insulated gate field effect transistor portion MFT is equipped with a first conductivity type drift layer DRF, a second conductivity type body region BDR, a first conductivity type source region SCR, a gate insulating film GTI, a gate electrode GTE, and a source electrode SCE. The insulated gate field effect transistor portion MFT may be equipped further with a drain electrode DRE, at least one second conductivity type semiconductor column SCLM, an insulator column ICLM, and an interlayer insulating film IL.

The first conductivity type drift layer DRF is placed in the semiconductor substrate SUB. The drift layer DRF may be placed in the second region PER or may not be placed in the second region PER. The drift layer DRF may be placed on the substrate region SBR. The drift layer DRF has a first conductivity type impurity concentration lower than that of the substrate region SBR. The drift layer DRF has an electrical resistivity higher than that of the substrate region SBR. The drift layer DRF has a thickness $t_1$ in the third direction (z direction). The drift layer DRF may be, for example, an $n^-$ type silicon layer.

The second conductivity type body region BDR is placed on the side of the first main surface S1 in the drift layer DRF in the semiconductor substrate SUB. The body region BDR has a thickness $t_2$ in the third direction (z direction). The body region BDR may be, for example, a p type silicon layer.

The first conductivity type source region SCR is placed on the side of the first main surface S1 in the body region BDR in the semiconductor substrate SUB. The first conductivity type source region SCR has a first conductivity type impurity concentration higher than that of the drift layer DRF. The source region SCR has an electrical resistivity lower than that of the drift layer DRF. The source region SCR may be discretely placed along the first direction (x direction) in the first main surface S1. The source region SCR may extend along the second direction (y direction). The source region SCR may be, for example, an $n^+$ type silicon region.

The gate insulating film GTI is placed on a portion of the body region BDR sandwiched between the drift layer DRF and the source region SCR. The portion of the body region BDR sandwiched between the drift layer DRF and the source region SCR is a portion where a channel is to be formed when the insulated gate field effect transistor portion MFT is ON state. The gate insulating film GTI has a thickness $t_3$ between the gate electrode GTE and the body region BDR. The gate insulating film GTI may be placed in a gate trench GTT provided in the first main surface S1. The gate trench GTT may be placed in both the second conductivity type body region BDR and the first conductivity type drift layer DRF. The gate insulating film GTI may come into contact with the second conductivity type body region BDR and the first conductivity type drift layer DRF. The gate insulating film GTI may be, for example, a silicon dioxide film.

The gate electrode GTE is placed so as to face the portion of the body region BDR sandwiched between the drift layer DRF and the source region SCR while having the gate insulating film GTI therebetween. The gate electrode GTE may be placed in the gate trench GTT provided in the first main surface S1. The gate electrode GTE may be a trench gate type gate electrode GTE. The gate electrode GTE may be placed on the first main surface S1 and may be a planar type gate electrode GTE. The gate electrode GTE is discretely placed along the first direction (x direction) in the first main surface S1. The gate electrode GTE extends along the second direction (y direction). The gate electrode GTE has a height $h_1$ in the third direction (z direction). The height $h_1$ of the gate electrode GTE is greater than the thickness $t_2$ of the body region BDR. The gate electrode GTE may be, for example, a polycrystalline silicon film. Referring to FIG. 2, the gate electrode GTE is electrically coupled to the gate wiring GTW via a contact hole (not shown).

The source electrode SCE is placed on the first main surface S1 of the semiconductor substrate SUB. The source electrode SCE is electrically coupled to the source region SCR. The source electrode SCE is electrically coupled to the source region SCR, the second conductivity type body region BDR, the semiconductor column SCLM of the insulated gate field effect transistor portion MFT, and a snubber electrode SNBE via the contact hole (not shown). The source electrode SCE may be, for example, an aluminum (Al) film.

The drain electrode DRE may be placed on the second main surface S2 of the semiconductor substrate SUB (substrate region SBR). The drain electrode DRE may be electrically coupled to the drift layer DRF and a snubber semiconductor region SNBS via the substrate region SBR. The insulated gate field effect transistor portion MFT may be a MOSFET having a vertical structure. The drain electrode DRE may be placed on the first main surface S1 of the semiconductor substrate SUB and the insulated gate field effect transistor portion MFT may be a MOSFET having a lateral structure. The drain electrode DRE may be, for example, an aluminum (Al) film.

The at least one second conductivity type semiconductor column SCLM may be placed in the drift layer DRF. The at least one semiconductor column SCLM may be placed in the second conductivity type body region BDR. The at least one semiconductor column SCLM may be in contact with and electrically coupled to the second conductivity type body region BDR. The at least one semiconductor column SCLM may be electrically coupled to the source electrode. The at least one semiconductor column SCLM may be placed on the side of the first main surface S1 in the semiconductor substrate SUB. The at least one semiconductor column SCLM may be placed, in plan view from the third direction (z direction), between a plurality of gate electrodes GTE. The at least one semiconductor column SCLM may be a plurality of semiconductor columns SCLM and the plurality of semiconductor columns SCLM may be placed in the drift layer DRF so as to sandwich therebetween the gate electrode GTE in plan view from the third direction (z direction). The plurality of semiconductor columns SCLM may be discretely placed in the first direction (x direction) in the drift layer DRF. The plurality of semiconductor columns SCLM may each extend along the second direction (y direction) in the drift layer DRF. The insulated gate field effect transistor portion MFT may have a superjunction structure having therein the second conductivity type semiconductor column SCLM and the first conductivity type drift layer DRF alternately placed in the first direction (x direction).

The semiconductor column SCLM has a height $h_2$ in the third direction (z direction). The height $h_2$ of the semiconductor column SCLM may be 0.5 times or more, preferably 0.7 times or more, more preferably 0.8 times or more the thickness $t_1$ of the drift layer DRF. The major portion of the drift layer DRF has, in the thickness direction (third direction, z direction) of the drift layer DRF, the semiconductor column SCLM. A depletion layer may therefore be formed in the major portion of the drift layer DRF in the thickness direction (third direction, z direction) of the drift layer DRF. As a result, the insulated gate field effect transistor portion MFT has an improved withstand voltage. The height $h_2$ of the semiconductor column SCLM may be greater than the thickness $t_2$ of the body region BDR. The height $h_2$ of the semiconductor column SCLM may be greater than the height $h_1$ of the gate electrode GTE. The height $h_2$ of the semiconductor column SCLM may be greater than the height of the gate trench GTT in the third direction (z direction). The semiconductor column SCLM may be, for example, a p type silicon region having a columnar structure.

The semiconductor column SCLM may be placed along a side wall of the at least one column trench CLMT in the drift layer DRF. The semiconductor column SCLM may be a region obtained by doping the side wall of the column trench CLMT with a second conductivity type impurity. The column trench CLMT may be provided on the side of the first main surface S1 of the semiconductor substrate SUB. The at least one column trench CLMT may be placed, in plan view from the third direction (z direction), between a plurality of gate trenches GTT. The at least one column trench CLMT may be comprised of a plurality of column trenches CLMT and these column trenches CLMT may be placed in the drift layer DRF so as to sandwich, in plan view from the third direction (z direction), the gate trench GTT between them. The plurality of column trenches CLMT may be discretely placed in the first direction (x direction) and extend along the second direction (y direction). The plurality of column trenches CLMT may be placed in the body region BDR and the drift layer DRF with a distance of of $g_1$ in the first direction (x direction). The at least one column trench CLMT may have a width $w_1$ in the first direction (x direction).

The column trench CLMT has a height $h_3$ in the third direction (z direction). The height $h_3$ of the column trench CLMT may be greater than that of the gate trench GTT in the third direction (z direction). The height $h_3$ of the column trench CLMT may be greater than the height $h_1$ of the gate electrode GTE. The height $h_3$ of the column trench CLMT may be 0.5 times or more, preferably 0.7 times or more, more preferably 0.8 times or more the thickness $t_1$ of the drift layer DRF. The major portion of the drift layer DRF has, in the thickness direction (third direction, z direction) of the drift layer DRF, the column trench CLMT. The semiconductor column SCLM may therefore be formed in the major portion of the drift layer DRF in the thickness direction (third direction, z direction) of the drift layer DRF. As a result, the insulated gate field effect transistor portion MFT has an improved withstand voltage. The height $h_3$ of the column trench CLMT may be greater than the height $h_2$ of the semiconductor column SCLM.

The insulator column ICLM may be placed in the drift layer DRF. The insulator column ICLM may be placed also in the body region BDR. The insulator column ICLM may be placed also on the side of the first main surface S1 of the semiconductor substrate SUB. The insulator column ICLM may be placed in the column trench CLMT formed in the body region BDR and the drift layer DRF. The column trench CLMT may be filled with the insulator column ICLM. The insulator column ICLM may be placed, in plan view from the third direction (z direction), between the plurality of gate electrodes GTE. As the insulator column ICLM, a plurality of insulator columns ICLM may be provided and the plurality of insulator columns ICLM may be placed in the drift layer DRF so as to sandwich the gate electrode GTE between them in plan view from the third direction (z direction). The plurality of insulator columns ICLM may be discretely placed in the first direction (x direction) in the drift layer DRF. The plurality of insulator columns ICLM may each extend along the second direction (y direction) in the drift layer DRF.

The insulator column ICLM has a height $h_3$ in the third direction (z direction). The height $h_3$ of the insulator column ICLM may be 0.5 times or more, preferably 0.7 or more, more preferably 0.8 times or more the thickness $t_1$ of the drift layer DRF. The major portion of the drift layer DRF has, in the thickness direction (third direction, z direction) of the drift layer DRF, the insulator column ICLM. The insulated gate field effect transistor portion MFT therefore has an improved withstand voltage. The height $h_3$ of the insulator column ICLM may be greater than the thickness $t_2$ of the body region BDR. The height $h_3$ of the insulator column ICLM may be greater than the height $h_1$ of the gate electrode GTE. The insulator column ICLM may be, for example, a silicon dioxide layer having a columnar structure.

The insulating film IL is placed on the first main surface S1 of the semiconductor substrate SUB. The interlayer insulating film IL has therein a through-hole TH. Via a contact hole placed in the through-hole TH, the source electrode SCE is electrically coupled to the source region SCR, the second conductivity type body region BDR, the semiconductor column SCLM of the insulated gate field effect transistor portion MFT, and a snubber electrode SNBE. The interlayer insulating film IL may be, for example, a silicon dioxide film.

Referring to FIGS. 2 to 4 and FIG. 6, the snubber portion SNB is placed in the second region PER of the semiconductor substrate SUB. The snubber portion SNB includes a first conductivity type snubber semiconductor region SNBS, a snubber insulating film, and a snubber electrode SNBE. The snubber portion SNB may or may not include the body region BDR.

The snubber semiconductor region SNBS is placed in the semiconductor substrate SUB. The snubber semiconductor region SNBS may be placed on the substrate region SBR. The snubber semiconductor region SNBS is electrically coupled to the drain electrode DRE. More specifically, the snubber semiconductor region SNBS is electrically coupled to the drain electrode DRE via the substrate region SBR. The first conductivity type impurity concentration in the snubber semiconductor region SNBS is greater than that in the drift layer DRF. More specifically, the first conductivity type impurity concentration in the snubber semiconductor region SNBS is 1.5 times or more, preferably 2 times or more, more preferably 5 times or more that in the drift layer DRF. The snubber semiconductor region SNBS has a thickness $t_4$ in the third direction (z direction). The thickness $t_4$ of the snubber semiconductor region SNBS may be greater than the thickness $t_1$ of the drift layer DRF or substantially equal to the thickness $t_1$ of the drift layer DRF. The thickness $t_4$ of the snubber semiconductor region SNBS may be substantially equal to the sum of the thickness $t_1$ of the drift layer DRF and the thickness $t_2$ of the body region BDR. The snubber semiconductor region SNBS may be, for example, an n type silicon layer.

A snubber trench SNBT is provided on the side of the first main surface S1 of the snubber semiconductor region SNBS. The snubber trench SNBT may have, for example, a meander shape in plan view from from the third direction (z direction). The snubber trench SNBT may have a plurality of snubber trench portions SNBTP extending in parallel to each other in the first main surface S1. The plurality of snubber trench portions SNBTP may be discretely placed in the snubber semiconductor region SNBS at a distance of $g_2$ in the first direction (x direction). The distance $g_2$ between the plurality of snubber trench portions SNBTP may be set smaller than the distance $g_1$ (refer to FIG. 5) between the plurality of column trenches CLMT. The plurality of snubber trench portions SNBTP may each extend along the second direction (y direction). The snubber trench portions SNBTP (snubber trench SNBT) may have a width $w_2$ in the first direction (x direction). The width $w_2$ of the snubber trench portions SNBTP (snubber trench SNBT) may be greater than the width $w_1$ of the column trench CLMT (refer to FIG. 5).

The snubber trench portions SNBTP (snubber trench SNBT) have a height $h_4$ in the third direction (z direction). The height $h_4$ of the snubber trench portions SNBTP (snubber trench SNBT) may be 0.5 times or more, preferably 0.7 times or more, more preferably 0.8 times or more the thickness $t_4$ of the snubber semiconductor region SNBS. A snubber insulating film SNBI may be formed in the major portion of the snubber semiconductor region SNBS in the thickness direction (third direction, z direction) of the snubber semiconductor region SNBS so that the snubber portion SNB may have an improved withstand voltage. In addition, an increase in the height $h_4$ of the snubber insulating film SNBI and the height $h_5$ of the snubber electrode SNBE may increase a snubber capacity $C_{snb}$. As a result, a surge voltage at turn-off of the insulated gate field effect transistor portion MFT may be reduced and at the same time, the insulated gate field effect transistor portion MFT may be suppressed from being destroyed. The height $h_4$ of the snubber trench portions SNBTP (snubber trench SNBT) may be greater than the thickness $t_1$ of the drift layer DRF. The height $h_4$ of the snubber trench portions SNBTP (snubber trench SNBT) may be greater than the thickness $t_2$ of the body region BDR. The height $h_4$ of the snubber trench portions SNBTP (snubber trench SNBT) may be greater than the height $h_1$ of the gate electrode GTE. The height $h_4$ of the snubber trench SNBTP (snubber trench SNBT) may be 0.8 times or more but not more than 1.5 times the height $h_3$ of the column trench.

The snubber insulating film SNBI is placed in the snubber trench SNBT provided on the side of the first main surface S1 the snubber semiconductor region SNBS. The snubber insulating film SNBI is located between the snubber semiconductor region SNBS and the snubber electrode SNBE and electrically insulates the snubber electrode SNBE from the snubber semiconductor region SNBS. The thickness $t_5$ of the snubber insulating film SNBI between the snubber semiconductor region SNBS and the snubber electrode SNBE is greater than the thickness $t_3$ (refer to FIG. 5) of the gate insulating film GTI between the gate electrode GTE and the body region BDR. More specifically, the thickness $t_5$ of the snubber insulating film SNBI between the snubber semiconductor region SNBS and the snubber electrode SNBE may be 1.5 times or more, preferably 2 times or more, more preferably 5 times or more the thickness $t_3$ of the gate insulating film GTI between the gate electrode GTE and the body region BDR.

The snubber insulating film SNBI has a height $H_4$ in the third direction (z direction). The height $h_4$ of the snubber insulating film SNBI may be 0.5 times or more, preferably 0.7 times or more, more preferably 0.8 times or more the thickness $t_4$ of the snubber semiconductor region SNBS. An increase in the height $h_4$ of the snubber insulating film SNBI may increase the snubber capacity $C_{snb}$. As a result, a surge voltage at turn-off of the insulated gate field effect transistor portion MFT can be reduced and at the same time, the insulated gate field effect transistor portion MFT can be suppressed from being destroyed. The height $h_4$ of the snubber insulating film SNBI may be greater than the thickness $t_1$ of the drift layer DRF. The height $h_4$ of the snubber insulating film SNBI may be greater than the thickness $t_2$ of the gate electrode GTE. The height $h_4$ of the snubber insulating film SNBI may be greater than the height $h_1$ of the gate electrode GTE. The snubber insulating film SNBI may be, for example, a silicon dioxide film.

The snubber electrode SNBE is placed in the snubber trench SNBT and on the snubber insulating film SNBI. The snubber electrode SNBE may be placed in the snubber trench portions SNBTP of the snubber trench SNBT. The snubber electrode SNBE faces the snubber semiconductor region SNBS with the snubber insulating film SNBI therebetween. The snubber electrode SNBE is electrically coupled to the source electrode SCE. The snubber electrode SNBE may have a meander shape in plan view from the third direction (z direction. The snubber electrode SNBE having a meander shape can have an increased snubber capacity $C_{snb}$ because it has a large surface area. As a result, a surge voltage at turn-off of the insulated gate field effect transistor portion MFT can be reduced and at the same time, the insulated gate field effect transistor portion MFT can be suppressed from being destroyed.

The snubber electrode SNBE has a height $h_5$ in the third direction (z direction). The height $h_5$ of the snubber electrode SNBE may be 0.5 times or more, preferably 0.7 times or more, more preferably 0.8 times or more the thickness $t_4$ of the snubber semiconductor region SNBS. An increase in the height $h_5$ of the snubber electrode SNBE may increase the snubber capacity $C_{snb}$. As a result, a surge voltage at turn-off of the insulated gate field effect transistor portion MFT can be reduced and at the same time, the insulated gate field effect transistor portion MFT can be suppressed from being destroyed. The height $h_5$ of the snubber electrode SNBE may be greater than the thickness $t_1$ of the drift layer DRF. The height $h_5$ of the snubber electrode SNBE may be greater than the thickness $t_2$ of the body region BDR. The height $h_5$ of the snubber electrode SNBE may be greater than the height $h_1$ of the gate electrode GTE. The snubber electrode SNBE may be, for example, a polycrystalline silicon film.

The snubber portion SNB may include the second conductivity type semiconductor column SCLM. The semiconductor column SCLM in the snubber portion SNB is placed in the snubber semiconductor region SNBS. The semiconductor column SCLM in the snubber portion SNB is electrically isolated from the source electrode SCE. The semiconductor column SCLM in the snubber portion SNB may be, for example, a p type silicon region having a columnar structure. The semiconductor column SCLM in the snubber portion SNB may be placed along the side wall of the snubber trench portions SNBTP (snubber trench SNBT) in the snubber semiconductor region SNBS. The semiconductor column SCLM in the snubber portion SNB may be a region obtained by doping a second conductivity type impurity into the side wall of the snubber trench portions SNBTP (snubber trench SNBT). The second conductivity type semiconductor column SCLM in the snubber portion SNB may be omitted.

Referring to FIGS. 2, 4, and 5, the semiconductor device SC1 of the present embodiment may be equipped further with, in the second region PER, an isolation structure SPR between the insulated gate field effect transistor portion MFT and the snubber portion SNB. The isolation structure SPR electrically isolates the snubber portion SNB from the insulated gate field effect transistor portion MFT.

The isolation structure SPR may be electrically coupled to the source electrode SCE and at the same time may include a second conductivity type impurity-containing region ICR having a second conductivity type impurity. The second conductivity type impurity-containing region ICR is placed in the semiconductor substrate SUB. The second conductivity type impurity-containing region ICR may be placed on the substrate region SBR. The second conductivity type impurity-containing region ICR may be a portion of the second conductivity type semiconductor layer SL on the substrate region SBR. The isolation structure SPR may be electrically coupled to the drain electrode DRE. More specifically, the isolation structure SPR may be electrically coupled to the drain electrode DRE via the substrate region SBR. The concentration of the second conductivity type impurity in the second conductivity type impurity-containing region ICR may be smaller than that of the first conductivity type impurity in the drift layer DRF. The thickness $t_6$ of the second conductivity type impurity-containing region ICR may be equal to the thickness $t_1$ of the drift layer DRF or greater than the thickness $t_1$ of the drift layer DRF. The isolation structure SPR may or may not include the body region BDR. The isolation structure SPR may be an insulator layer instead of the second conductivity type impurity-containing region ICR.

Figure 7:
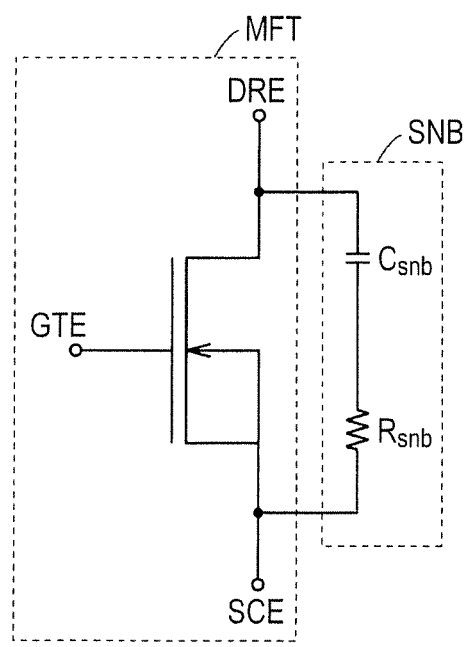
FIG. 7 is a schematic circuit diagram of semiconductor devices of First Embodiment to Third Embodiment.

Referring to FIG. 7, the circuit configuration of the semiconductor device SC1 of the present embodiment will next be described. The snubber portion SNB includes a snubber capacity $C_{snb}$ which is a capacity of the snubber portion SNB and a snubber resistance $R_{snb}$ which is an electrical resistance of the snubber portion SNB. The snubber portion SNB is electrically coupled to the drain electrode DRE of the insulated gate field effect transistor portion MFT. More specifically, the snubber semiconductor region SNBS is electrically coupled to the drain electrode DRE of the insulated gate field effect transistor portion MFT (refer to FIG. 4). The snubber portion SNB is electrically coupled to the source electrode SCE of the insulated gate field effect transistor portion MFT. More specifically, the snubber electrode SNBE is electrically coupled to the source electrode SCE of the insulated gate field effect transistor portion MFT (refer to FIG. 4).

One example of the method of manufacturing the semiconductor device SC1 of the present embodiment will next be described referring to FIG. 4 and FIG. 8 to FIG. 19.

Figure 8:
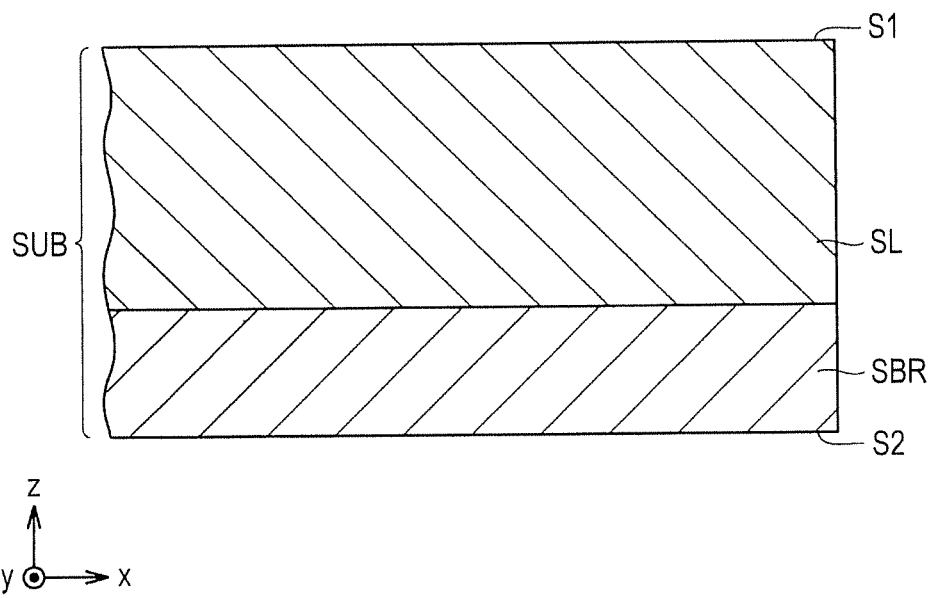
FIG. 8 is a schematic cross-sectional view showing a step in a manufacturing method of a semiconductor device according to First Embodiment.

Referring to FIG. 8, the method of manufacturing a semiconductor device SC1 according to the present embodiment has a step of providing a semiconductor substrate SUB having a first main surface S1 and a second main surface S2 opposite to each other. The step of providing a semiconductor substrate SUB may include forming a semiconductor layer SL on a first conductivity type substrate region SBR. The semiconductor layer SL is included in the semiconductor substrate SUB. The semiconductor layer SL may have the first main surface S1. The substrate region SBR may have the second main surface S2. The semiconductor layer SL may contain a second conductivity type impurity and have a second conductivity type. More specifically, the step of providing a semiconductor substrate SUB may include forming a p type semiconductor layer SL on an n$^+$ type substrate region SBR by epitaxial growth.

Figure 9:
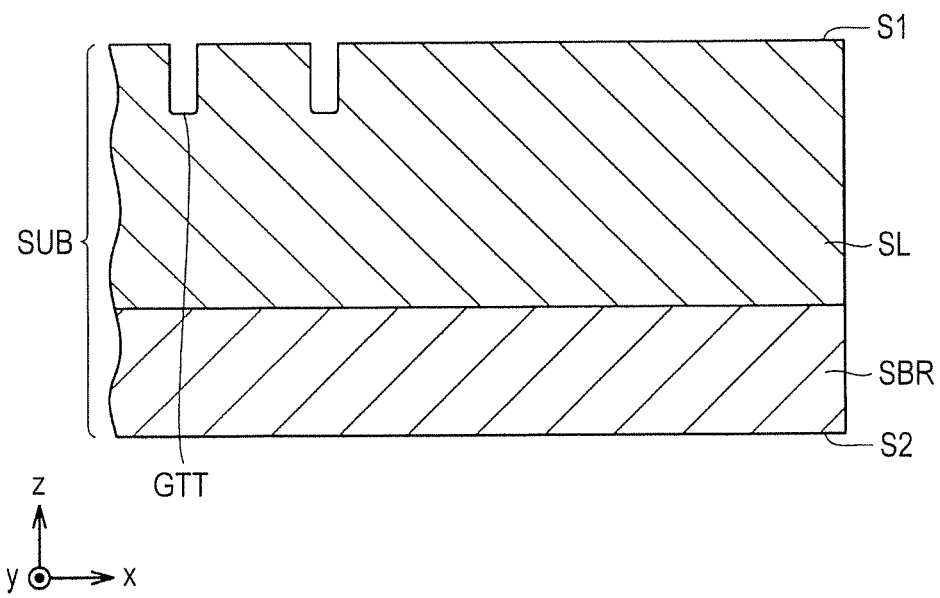
FIG. 9 is a schematic cross-sectional view showing a step, following that shown in FIG. 8, in the method of manufacturing a semiconductor device according to First Embodiment.
Figure 10:
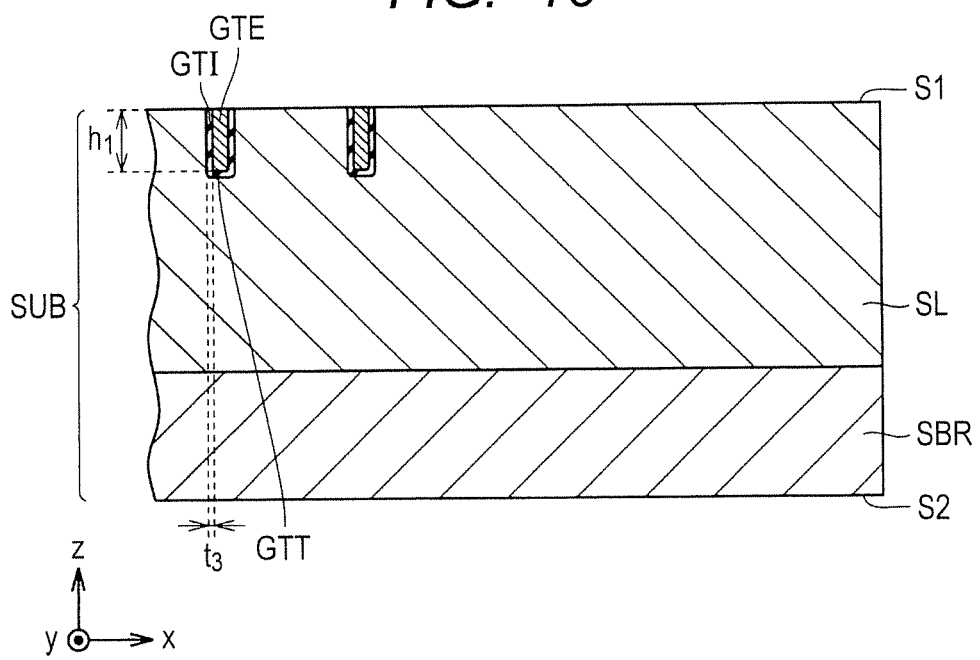
FIG. 10 is a schematic cross-sectional view showing a step, following that shown in FIG. 9, in the method of manufacturing a semiconductor device according to First Embodiment.

Referring to FIGS. 9 and 10, the method of manufacturing a semiconductor device SC1 according to the present embodiment has a step of forming a gate insulating film GTI and a gate electrode GTE. More specifically, referring to FIG. 9, a gate trench GTT is formed in the first main surface S1 of the semiconductor substrate SUB (semiconductor layer SL). The gate trench GTT may be formed in the first main surface S1 of the semiconductor substrate SUB (semiconductor layer SL) by anisotropically etching the first main surface S1 of the semiconductor substrate SUB (semiconductor layer SL). Referring to FIG. 10, the gate insulating film GTI and the gate electrode GTE are formed in the gate trench GTT. The gate insulating film GTI has a thickness $t_3$ between the gate electrode GTE and the body region BDR. The gate electrode GTE has a height $h_1$ in the third direction (z direction).

Figure 11:
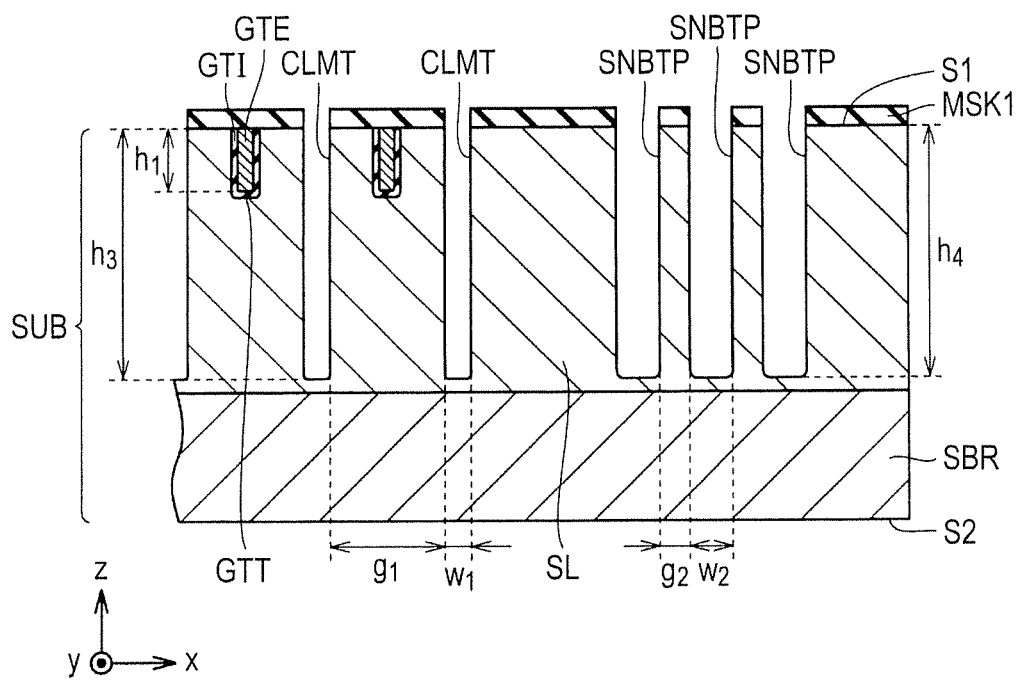
FIG. 11 is a schematic cross-sectional view showing a step, following that shown in FIG. 10, in the method of manufacturing a semiconductor device according to First Embodiment.

Referring to FIG. 11, the method of manufacturing a semiconductor device SC1 according to the present embodiment includes forming a column trench CLMT in the first main surface S1 of the semiconductor substrate SUB (semiconductor layer SL) and forming a snubber trench SNBT in the first main surface S1 of the semiconductor substrate SUB (semiconductor layer SL). The method of manufacturing a semiconductor device SC1 according to the present embodiment may include forming a plurality of column trenches CLMT in the first main surface S1 of the semiconductor substrate SUB (semiconductor layer SL). Forming a snubber trench SNBT may include forming a plurality of snubber trench portions SNBTP extending in parallel to each other in the first main surface S1. The plurality of snubber trench portions SNBTP may be formed so that a distance $g_2$ between the plurality of snubber trench portions SNBTP becomes smaller than a distance $g_1$ between the plurality of column trenches CLMT. The snubber trench SNBT (snubber trench portions SNBTP) may be formed so that the snubber trench SNBT (snubber trench portions SNBTP) has a width greater than that of the column trench CLMT. The snubber trench portions SNBTP (snubber trench SNBT) may be formed so that the snubber trench portions SNBTP (snubber trench SNBT) have a width $w_2$ greater than the width $w_1$ of the column trench CLMT. The height $h_3$ of the column trench CLMT and the height $h_4$ of the snubber trench portions SNBTP (snubber trench SNBT) may be greater than the height $h_1$ of the gate electrode GTE. The height $h_4$ of the snubber trench portions SNBTP (snubber trench SNBT) may be 0.8 times or more but not more than 1.5 times the height $h_3$ of the column trench CLMT.

Forming a column trench CLMT and forming a snubber trench SNBT (a plurality of snubber trench portions SNBTP) may be performed in the same step. More specifically, a first mask MSK1 having an opening portion is formed on the first main surface S1 of the semiconductor substrate SUB (semiconductor layer SL). The first mask MSK1 may be made of, for example, silicon dioxide or a photoresist. The semiconductor substrate SUB (semiconductor layer SL) is anisotropically etched using the first mask MSK1. Thus, the column trench CLMT and the snubber trench SNBT (the plurality of snubber trench portions SNBTP) are formed in the first main surface S1 of the semiconductor substrate SUB (the semiconductor layer SL).

Figure 12:
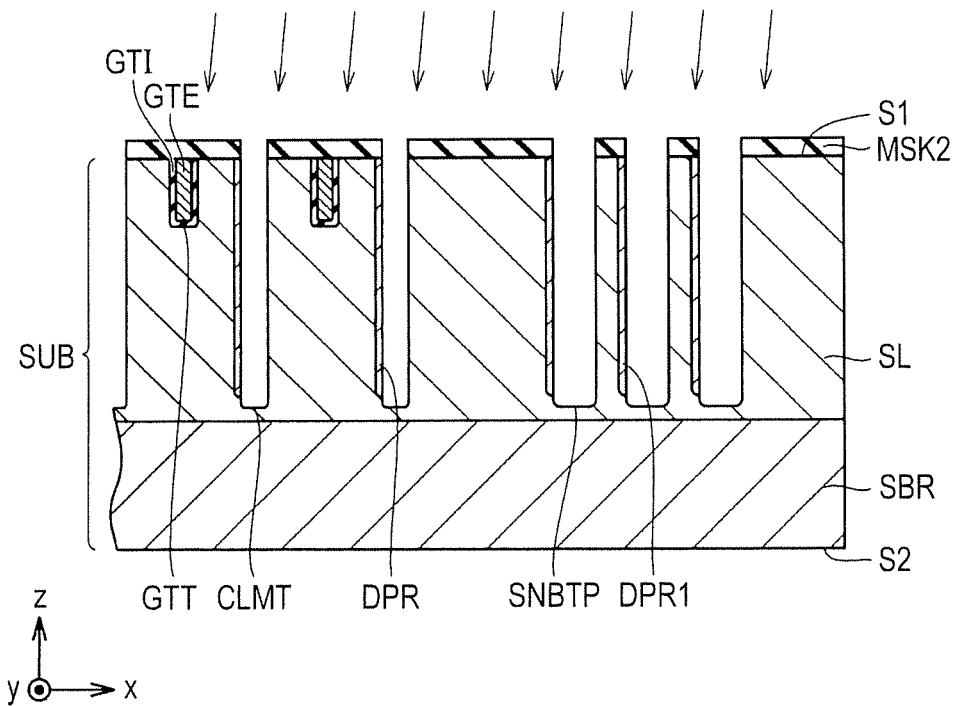
FIG. 12 is a schematic cross-sectional view showing a step, following that shown in FIG. 11, in the method of manufacturing a semiconductor device according to First Embodiment.
Figure 13:
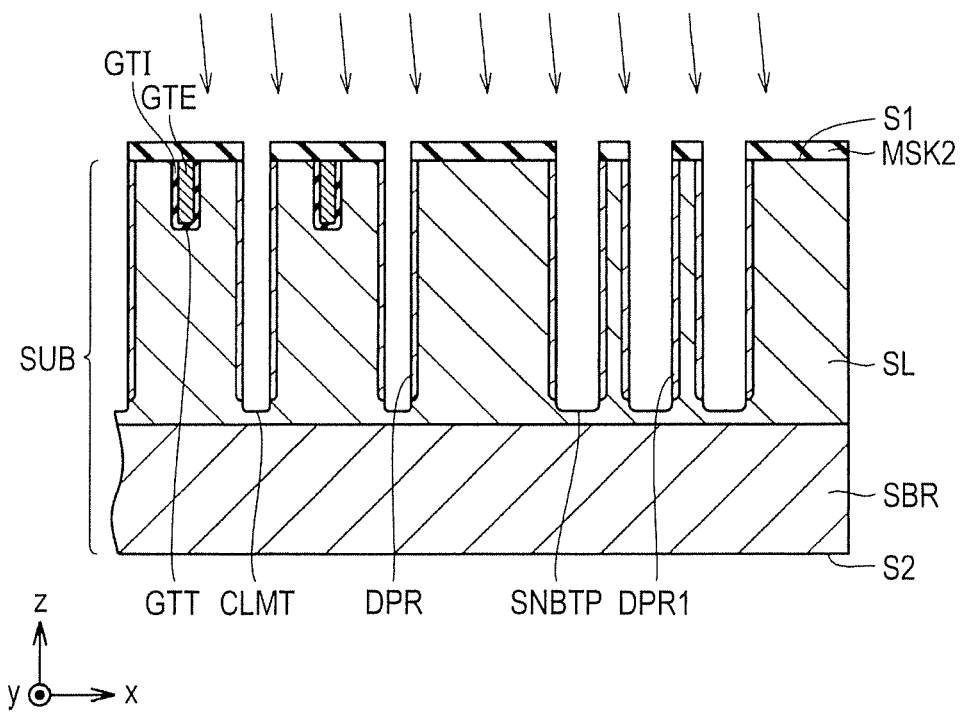
FIG. 13 is a schematic cross-sectional view showing a step, following that shown in FIG. 12, in the method of manufacturing a semiconductor device according to First Embodiment.

Referring to FIGS. 12 and 13, the method of manufacturing a semiconductor device SC1 according to the present embodiment includes a step of forming a first conductivity type impurity-containing region DPR1 on the side wall of the column trench CLMT and the side wall of the snubber trench SNBT. The step of forming a first conductivity type impurity-containing region DPR1 may include doping a first conductivity type impurity into the side wall of the column trench CLMT and the side wall of the snubber trench SNBT from a direction inclined to the normal direction (-z direction) of the first main surface S1. The first conductivity type impurity may be, for example, phosphorus (P).

Described specifically, referring to FIG. 12, a second mask MSK2 having an opening portion is formed on the first main surface S1 of the semiconductor substrate SUB. The second mask MSK2 may be made of, for example, silicon dioxide or a photoresist. A first conductivity type impurity may be ion-implanted into the side wall of the column trench CLMT on the side of the -x direction and the side wall of the snubber trench SNBT (side wall of the plurality of snubber trench portions SNBTP) on the side of the -x direction from a direction inclined to the -x direction relative to the normal direction (-z direction) of the first main surface S1. Referring to FIG. 13, a first conductivity type impurity may be ion-implanted into the side wall of the column trench CLMT on the side of the +x direction and the side wall of the snubber trench SNBT (side wall of the plurality of snubber trench portions SNBTP) on the side of the +x direction from a direction inclined to the +x direction relative to the normal direction (-z direction) of the first main surface S1. This inclined direction may be determined so as to prevent the first conductivity type impurity from being doped into the bottom portion of the column trench CLMT and the snubber trench SNBT.

Figure 14:
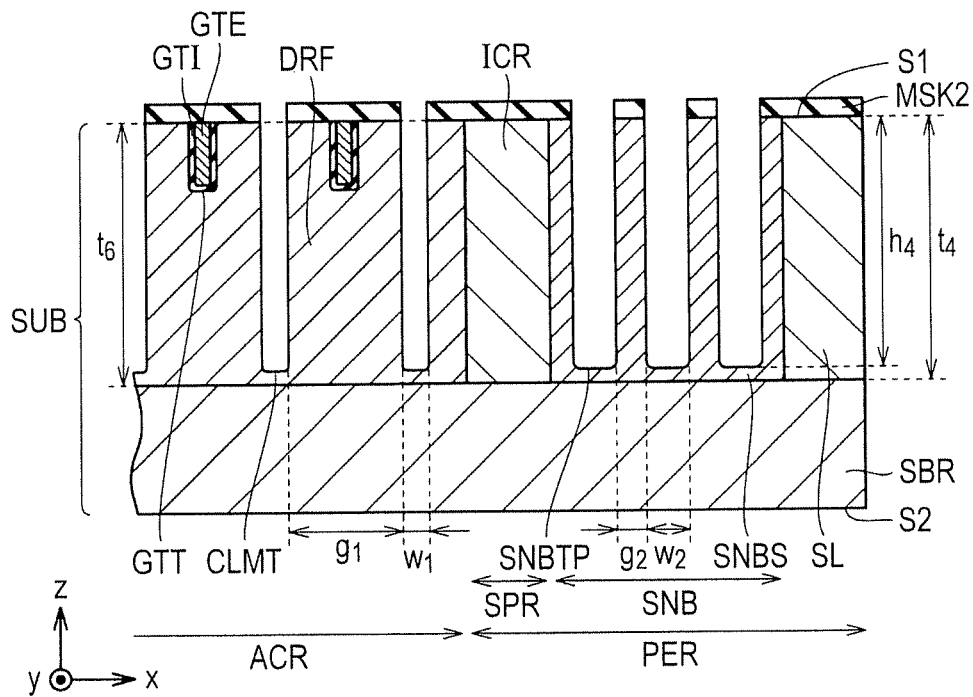
FIG. 14 is a schematic cross-sectional view showing a step, following that shown in FIG. 13, in the method of manufacturing a semiconductor device according to First Embodiment.

Referring to FIG. 14, the method of manufacturing a semiconductor device SC1 according to the present embodiment includes forming a first conductivity type drift layer DRF in the semiconductor substrate SUB and forming a first conductivity type snubber semiconductor region SNBS in the semiconductor substrate SUB (semiconductor layer SL). The snubber semiconductor region SNBS is formed so that the snubber semiconductor region SNBS has a first conductivity type impurity concentration greater than that in the drift layer DRF. The height $h_4$ of the snubber trench portions SNBTP (snubber trench SNBT) may be 0.5 times or more, preferably 0.7 times or more, more preferably 0.8 times or more the thickness $t_4$ of the snubber semiconductor region SNBS. The snubber semiconductor region SNBS may have a thickness equal to that of the semiconductor layer SL.

Forming a drift layer DRF and forming a snubber semiconductor region SNBS may be performed in the same step. More specifically, forming a drift layer DRF and forming a snubber semiconductor region SNBS may include diffusing, by a method such as thermal diffusion, a first conductivity type impurity doped into the side wall of the column trench CLMT and the side wall of the trench SNBT into the semiconductor layer SL. The first conductivity type impurity doped into the side wall of the plurality of column trenches CLMT and the side wall of the plurality of the snubber trench portions SNBTP is activated and at the same time diffused in the drift layer, for example, by heat treatment at 1000° C. or more but not more than 1200° C. Thus, the first conductivity type drift layer DRF is formed around the column trench CLMT and the first conductivity type snubber semiconductor region SNBS is formed around the snubber trench SNBT. In other words, the column trench CLMT is formed in the drift layer DRF and the snubber trench SNBT is formed on the side of the first main surface S1 of the snubber semiconductor region SNBS.

The distance $g_2$ between the plurality of snubber trench portions SNBTP is smaller than the distance $g_1$ between the plurality of column trenches CLMT. The concentration of the first conductivity type impurity diffused into the semiconductor layer SL around the plurality of snubber trench portions SNBTP becomes greater than the concentration of the first conductivity type impurity diffused in the semiconductor layer SL between the plurality of column trenches CLMT. Thus, the snubber semiconductor region SNBS thus formed can have a first conductivity type impurity concentration, in the snubber semiconductor region SNBS around the snubber trench portions SNBTP (snubber trench SNBT), greater than the first conductivity type impurity concentration in the drift layer DRF around the column trench CLMT.

The method of manufacturing a semiconductor device SC1 according to the present embodiment further includes forming a second conductivity type impurity-containing region ICR between the drift layer DRF and the snubber semiconductor region SNBS in the semiconductor substrate SUB (semiconductor layer SL). By forming the drift layer DRF and the snubber semiconductor region SNBS, the second conductivity type impurity-containing region ICR containing the second conductivity type impurity may be formed between the drift layer DRF and the snubber semiconductor region SNBS. The second conductivity type impurity-containing region ICR may be a second conductivity type semiconductor layer SL between the drift layer DRF and the snubber semiconductor region SNBS. The concentration of the second conductivity type impurity in the second conductivity type impurity-containing region ICR may be smaller than the concentration of the first conductivity type impurity in the drift layer DRF. The second conductivity type impurity-containing region ICR has a thickness $t_6$ in the third direction (z direction). The second conductivity type impurity-containing region ICR may have a thickness equal to that of the semiconductor layer SL.

By forming the drift layer DRF and the snubber semiconductor region SNBS in a portion of the second conductivity type semiconductor layer SL, a second conductivity type impurity-containing region ICR containing the second conductivity type impurity may be formed between the drift layer DRF and the snubber semiconductor region SNBS. The second conductivity type semiconductor layer SL between the column trench CLMT and the snubber trench SNBT has a region of the first conductivity type impurity-containing region DPR1 not diffused with the first conductivity type impurity. In such a manner, the second conductivity type impurity-containing region ICR is formed between the first conductivity type drift layer DRF and the first conductivity type snubber semiconductor region SNBS. Forming a drift layer DRF, forming a snubber semiconductor region SNBS, and forming a second conductivity type impurity-containing region ICR may be performed in one step as a step of diffusing, in the semiconductor layer SL, the first conductivity type impurity doped into the side wall of the column trench CLMT and the side wall of the snubber trench SNBT, that is, the first conductivity type impurity in the first conductivity type impurity-containing region DPR1. The first conductivity type drift layer DRF is included in the first region. The first conductivity type snubber semiconductor region SNBS and the second conductivity type impurity-containing region ICR are included in the second region. The second region is located around the first region.

Figure 15:
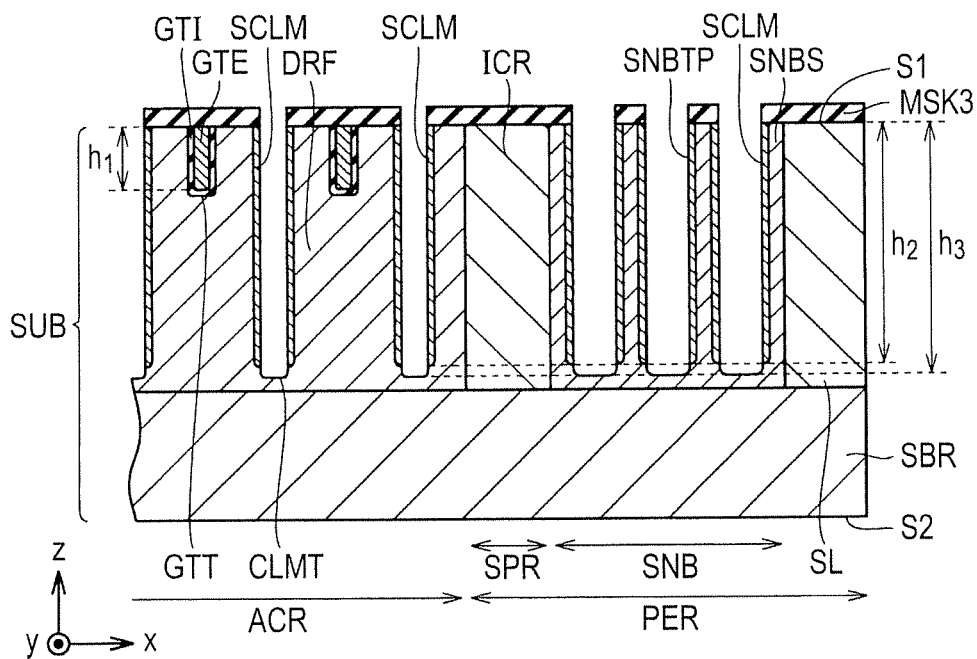
FIG. 15 is a schematic cross-sectional view showing a step, following that shown in FIG. 14, in the method of manufacturing a semiconductor device according to First Embodiment.

Referring to FIG. 15, the method of manufacturing a semiconductor device SC1 according to the present embodiment may include forming at least one second conductivity type semiconductor column SCLM in the drift layer DRF. A plurality of semiconductor columns SCLM may be formed in the drift layer DRF. More specifically, at least one semiconductor column SCLM may be formed along the side wall of the column trench CLMT in the drift layer DRF. A plurality of semiconductor column SCLM may be formed along the side wall of the plurality of column trench CLMT in the drift layer DRF. The at least one semiconductor column SCLM may have a height $h_2$ greater than the height $h_1$ of the gate electrode GTE. The at least one semiconductor column SCLM may have a height $h_2$ smaller than the height $h_3$ of the column trench CLMT.

More specifically, referring to FIG. 15, a third mask MSK3 having an opening portion is formed on the first main surface S1 of the semiconductor substrate SUB. The third mask MSK3 may be made of, for example, silicon dioxide or a photoresist. By steps similar to those shown in FIGS. 12 and 13, a second conductivity type impurity is doped into the side wall of the column trench CLMT and the side wall of the snubber trench SNBT from a direction inclined relative to the normal direction of the first main surface S1. The second conductivity type impurity may be, for example, boron (B). Then, the second conductivity type impurity doped into the side wall of the column trench CLMT and the side wall of the snubber trench SNBT is activated, for example, by heat treatment at a temperature of 800° C. or more but not more than 900° C. In such a manner, the at least one second conductivity type semiconductor column SCLM may be formed. A superjunction structure may be formed in which the second conductivity type semiconductor column SCLM and the first conductivity type drift layer DRF are placed alternately in the first direction (x direction).

Figure 16:
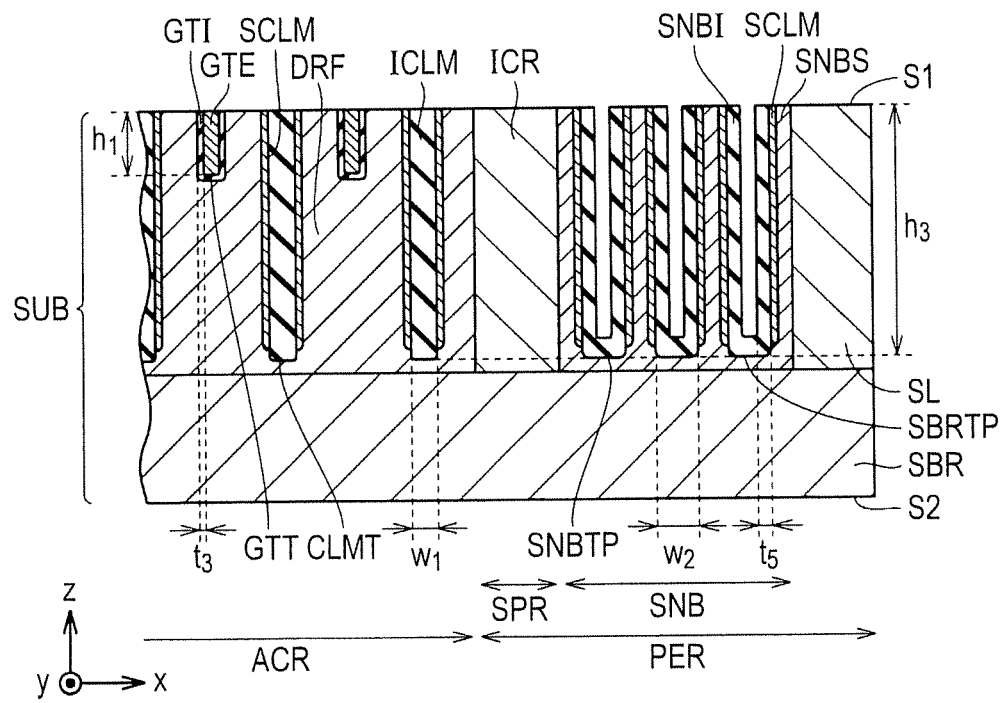
FIG. 16 is a schematic cross-sectional view showing a step, following that shown in FIG. 15, in the method of manufacturing a semiconductor device according to First Embodiment.

Referring to FIG. 16, the method of manufacturing a semiconductor device SC1 according to the present embodiment includes forming a snubber insulating film SNBI in the snubber trench SNBT. The snubber insulating film SNBI is formed so that the thickness $t_5$ of the snubber insulating film SNBI between the snubber semiconductor region SNBS and the snubber electrode SNBE becomes greater than the thickness $t_3$ of the gate insulating film GTI between the gate electrode GTE and the body region BDR.

Referring to FIG. 16, the method of manufacturing a semiconductor device SC1 according to the present embodiment includes forming an insulator column ICLM in the column trench CLMT. The insulator column ICLM may be formed so that the insulator column ICLM has a height $h_3$ greater than the height $h_1$ of the gate electrode GTE. Forming a snubber insulating film SNBI in the snubber trench SNBT and forming an insulator column ICLM in the column trench CLMT may be performed in one step. The snubber trench portions SNBTP (snubber trench SNBT) have a width $w_2$ greater than the width $w_1$ of the column trenches CLMT. When the snubber insulating film SNBI and the insulator column ICLM are formed in one step, therefore, the column trench CLMT is filled with the insulator column ICLM but the snubber trench SNBT is not filled with the snubber insulating film SNBI. After formation of the snubber insulating film SNBI, the snubber trench SNBT has a space therein.

Figure 17:
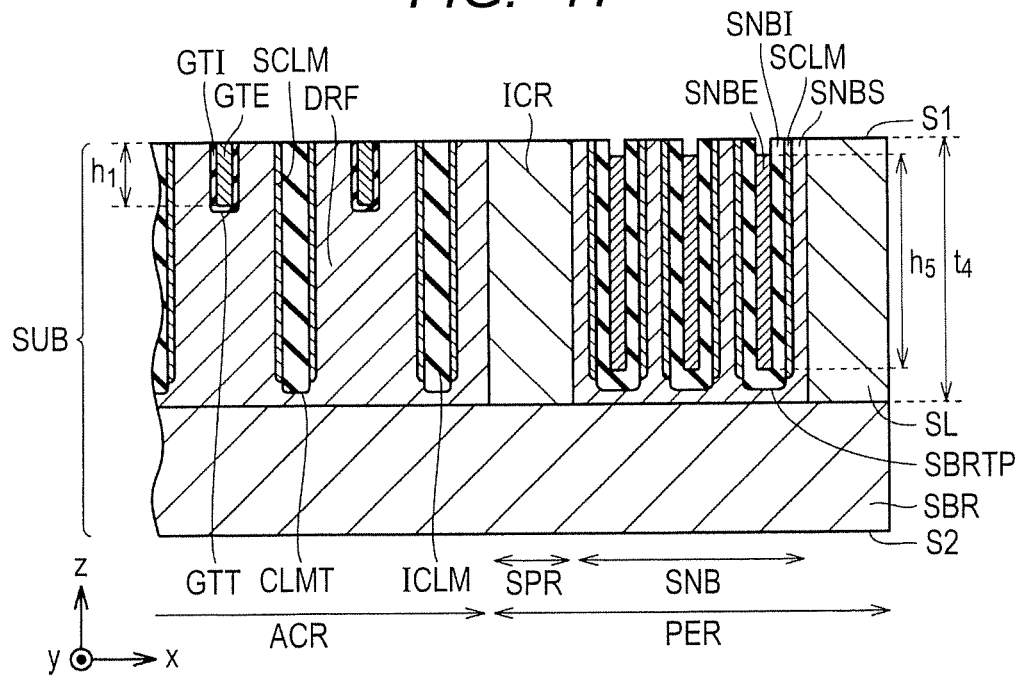
FIG. 17 is a schematic cross-sectional view showing a step, following that shown in FIG. 16, in the method of manufacturing a semiconductor device according to First Embodiment.

Referring to FIG. 17, the method of manufacturing a semiconductor device SC1 according to the present embodiment includes forming, in the snubber trench SNBT, a snubber electrode SNBE opposite to the snubber semiconductor region SNBS with the snubber insulating film SNBI therebetween. More specifically, the snubber electrode SNBE is formed in the snubber trench SNBT and at the same time, on the snubber insulating film SNBI by filling, with it, a major portion of the space in the snubber trench SNBT after formation of the snubber insulating film SNBI. The snubber electrode SNBE may be formed so that the snubber electrode SNBE has a height $h_5$, in the normal direction of the first main surface S1, greater than the height $h_1$ of the gate electrode GTE in the normal direction of the first main surface S1. The snubber electrode SNBE may be formed so that the snubber electrode SNBE has a height $h_5$ which is 0.5 times or more, preferably 0.7 times or more, more preferably 0.8 times or more the thickness $t_4$ of the snubber semiconductor region SNBS.

Figure 18:
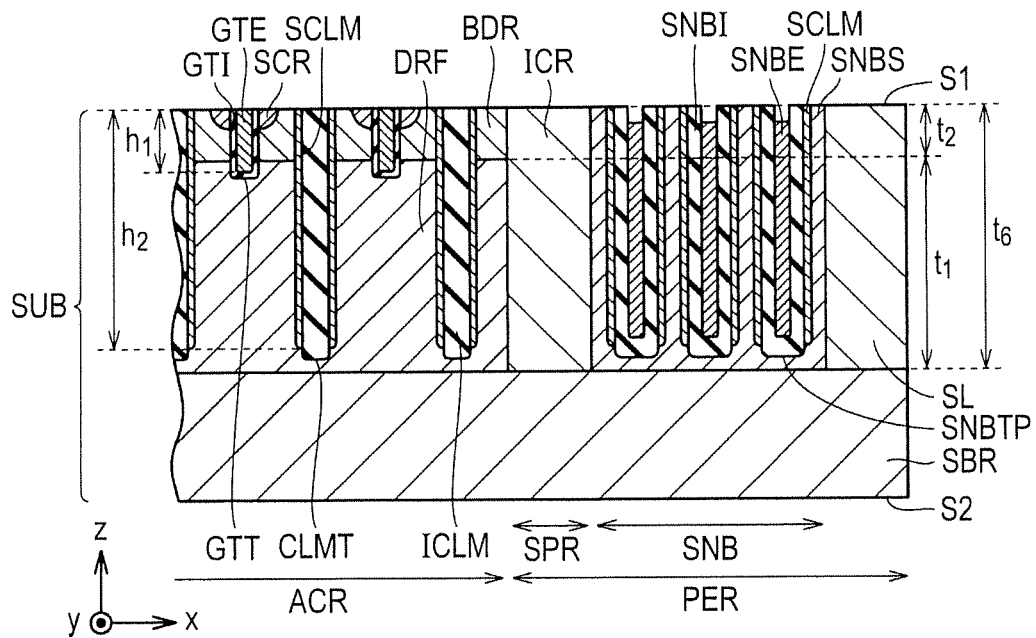
FIG. 18 is a schematic cross-sectional view showing a step, following that shown in FIG. 17, in the method of manufacturing a semiconductor device according to First Embodiment.

Referring to FIG. 18, the method of manufacturing a semiconductor device SC1 according to the present embodiment includes forming a body region BDR and forming a first conductivity type source region SCR. The body region BDR is formed on the side of the first main surface S1 of the drift layer DRF in the semiconductor substrate SUB. The body region BDR has a second conductivity type, which is a conductivity type different from the first conductivity type. The body region BDR may be formed by doping the first main surface S1 of the drift layer DRF with a second conductivity type impurity. In such a manner, the body region BDR having a thickness $t_2$ in the third direction (z direction) and the drift layer DRF having a thickness $t_1$ in the third direction (z direction) are formed. The source region SCR is formed on the side of the first main surface S1 of the body region BDR in the semiconductor substrate SUB. The source region SCR may be formed by doping the first main surface S1 of the body region BDR with a first conductivity type impurity. The source region SCR may be, for example, an $n^+$ type region. A gate insulating film GTI is formed on a portion of the body region BDR sandwiched between the drift layer DRF and the source region SCR. The gate electrode GTE is opposite to a portion of the body region BDR with the gate insulating film GTI therebetween.

The gate electrode GTE and the body region BDR are formed so that the height $h_1$ of the gate electrode GTE becomes greater than the thickness $t_2$ of the body region BDR. The semiconductor column SCLM and the drift layer DRF may be formed so that the semiconductor column SCLM has a height $t_2$ which is 0.5 times or more, preferably 0.7 times or more, more preferably 0.8 times or more the thickness $t_1$ of the drift layer DRF. The semiconductor column SCLM and the body region BDR may be formed so that the semiconductor column SCLM has a height $h_2$ greater than the thickness $t_2$ of the body region BDR. The second conductivity type impurity-containing region ICR and the drift layer DRF may be formed so that the second conductivity type impurity-containing region ICR has a thickness $t_6$ equal to the thickness $t_1$ of the drift layer DRF or greater than the thickness $t_1$ of the drift layer DRF.

Figure 19:
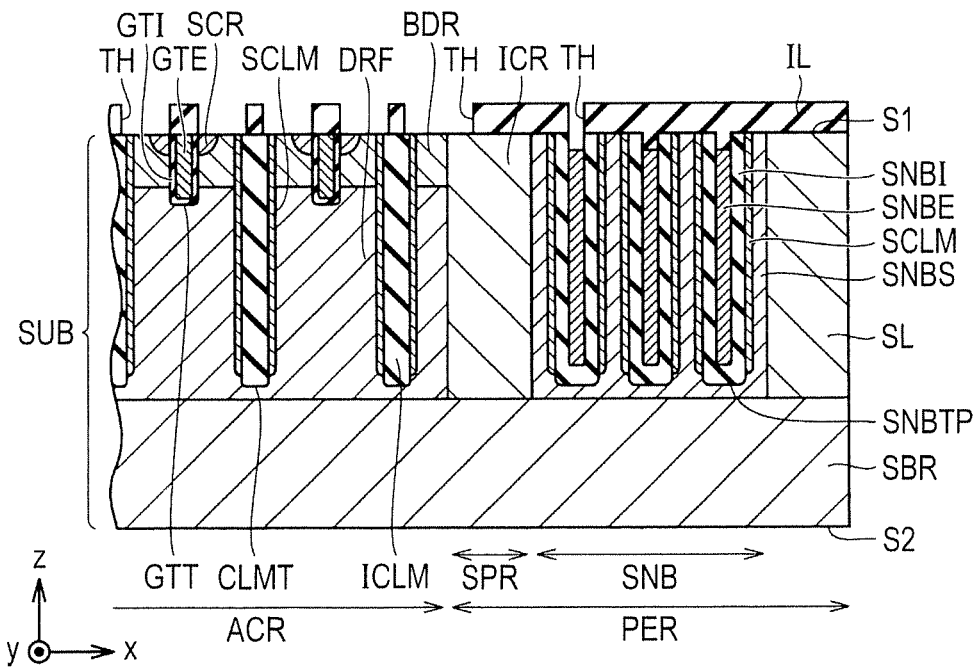
FIG. 19 is a schematic cross-sectional view showing a step, following that shown in FIG. 18, in the method of manufacturing a semiconductor device according to First Embodiment.
Figure 20:
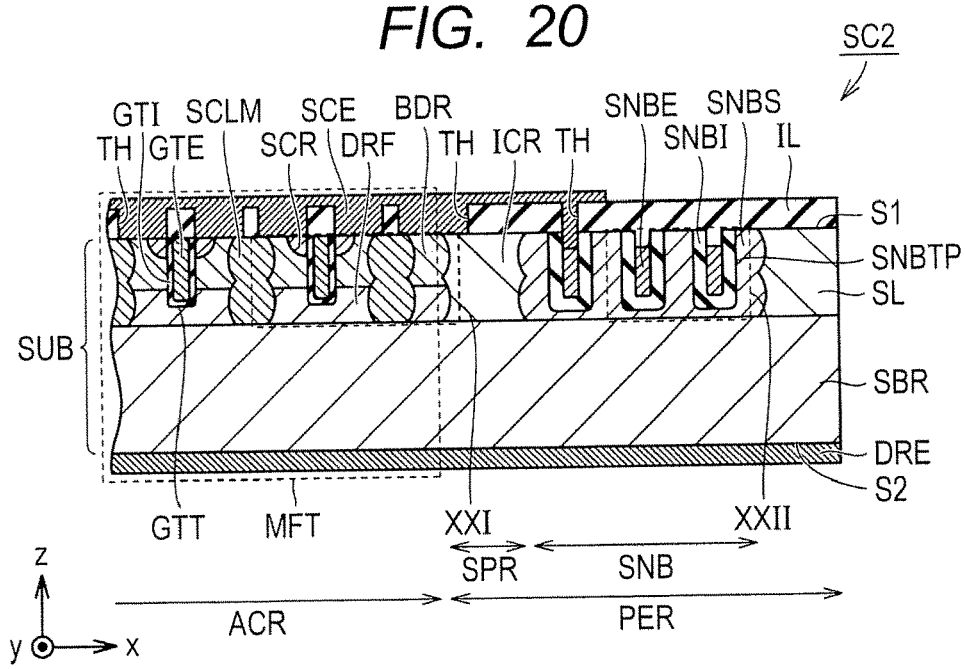
FIG. 20 is a schematic cross-sectional view of a semiconductor device according to Second Embodiment.
Figure 21:
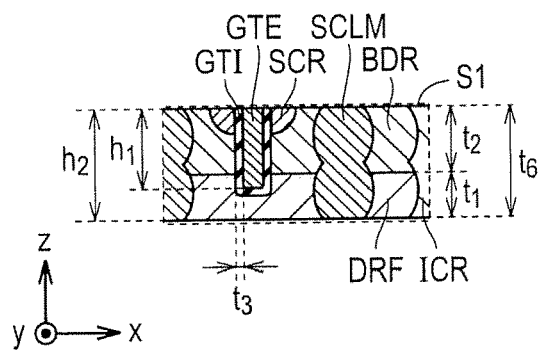
FIG. 21 is a schematic enlarged cross-sectional view of the region XXI, shown in FIG. 20, of the semiconductor device according to Second Embodiment.
Figure 22:
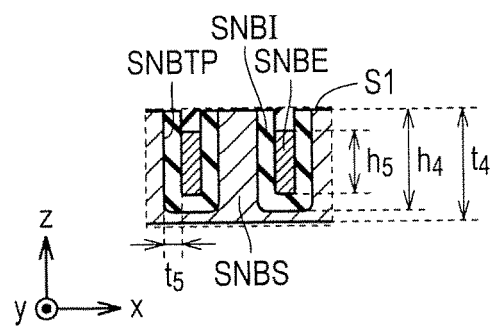
FIG. 22 is a schematic enlarged cross-sectional view of the region XXII, shown in FIG. 20, of the semiconductor device according to Second Embodiment.

Referring to FIG. 19, the method of manufacturing a semiconductor device SC1 according to the present embodiment includes forming an interlayer insulating film IL having a through-hole TH on the first main surface S1 of the semiconductor substrate SUB. The method of manufacturing a semiconductor device SC1 according to the present embodiment then includes forming a source electrode SCE on the first main surface S1 of the semiconductor substrate SUB and forming a drain electrode DRE on the second main surface S2 of the semiconductor substrate SUB. The source electrode SCE is electrically coupled to the source region SCR via a contact hole formed in the through-hole TH of the interlayer insulating film IL. Forming a source electrode SCE includes electrical coupling of the source electrode SCE to the snubber electrode SNBE. Forming a source electrode SCE may include electrical coupling of the second conductivity type body region BDR, the semiconductor column SCLM in the insulated gate field effect transistor portion MFT, and the second conductivity type impurity-containing region ICR to the source electrode SCE. Forming a drain electrode DRE may include electrical coupling of the substrate region SBR to the drain electrode DRE. The semiconductor device SC1 of the present embodiment may be manufactured by the above-described steps.

The effect and advantage of the present embodiment will next be described.

The semiconductor device SC1 of the present embodiment has a semiconductor substrate SUB, an insulated gate field effect transistor portion MFT placed in a first region ACR of the semiconductor substrate SUB, and a snubber portion SNB placed in a second region PER of the semiconductor substrate SUB around the first region ACR. The semiconductor substrate SUB has a first main surface S1 and a second main surface S2 opposite to each other. The insulated gate field effect transistor portion MFT includes a first conductivity type drift layer DRF, a body region BDR having a second conductivity type, which is a conductivity type different from the first conductivity type, a first conductivity type source region SCR, a gate insulating film GTI, a gate electrode GTE, and a source electrode SCE. The drift layer DRF is placed in the semiconductor substrate SUB. The body region BDR is placed on the side of the first main surface S1 of the drift layer DRF in the semiconductor substrate SUB. The source region SCR is placed on the side of the first main surface S1 of the body region BDR in the semiconductor substrate SUB. The gate insulating film GTI is placed on a portion of the body region BDR sandwiched between the drift layer DRF and the source region SCR. The gate electrode GTE is opposite to a portion of the body region BDR with the gate insulating film GTI therebetween. The source electrode SCE is placed on the first main surface S1 and at the same time, electrically coupled to the source region SCR. The snubber portion SNB includes a first conductivity type snubber semiconductor region SNBS, a snubber insulating film SNBI, a snubber electrode SNBE. The snubber semiconductor region SNBS is placed in the semiconductor substrate SUB. The snubber insulating film SNBI is placed in a snubber trench SNBT provided on the side of the first main surface S1 of the snubber semiconductor region SNBS. The snubber electrode SNBE is placed in the snubber trench SNBT and at the same time, is opposite to the snubber semiconductor region SNBS with the snubber insulating film SNBI therebetween. The snubber electrode SNBE is electrically coupled to the source electrode SCE. The concentration of a first conductivity type impurity in the snubber semiconductor region SNBS is greater than that in the drift layer DRF. The thickness $t_5$ of the snubber insulating film SNBI between the snubber semiconductor region SNBS and the snubber electrode SNBE is greater than the thickness $t_3$ of the gate insulating film GTI between the gate electrode GTE and the body region BDR.

In the semiconductor device SC1 of the present embodiment, the concentration of the first conductivity type impurity in the snubber semiconductor region SNBS is greater than that in the drift layer DRF. Almost no depletion region is therefore formed in the snubber semiconductor region SNBS. The snubber capacity $C_{snb}$, which is a capacity $C_{ox}$ of the snubber portion SNB, substantially consists of the capacity of an insulating film capacitor comprised of the snubber semiconductor region SNBS, the snubber insulating film SNBI, and the snubber electrode SNBE. The snubber semiconductor region SNBS having a first conductivity type impurity at a concentration higher than that of the drift layer DRF can prevent a decrease in the snubber capacity $C_{sub}$ due to the capacity $C_d$ of a depletion region capacitor (refer to Equation (1)). According to the semiconductor device SC1 of the present embodiment, the snubber portion SNB can reduce a surge voltage at turn-off of the insulated gate field effect transistor portion MFT and at the same time, can suppress the insulated gate field effect transistor portion MFT from being destroyed.

Further, in the semiconductor device SC1 of the present embodiment, the thickness $t_5$ of the the snubber insulating film SNBI between the snubber semiconductor region SNBS and the snubber electrode SNBE is greater than the thickness $t_3$ of the gate insulating film GTI between the gate electrode GTE and the body region BDR. Even if almost no depletion region is formed in the snubber semiconductor region SNBS, the snubber portion SNB can have an improved withstand voltage comparable to that of the insulated gate field effect transistor portion MFT.

In the semiconductor device SC1 of the present embodiment, the gate electrode GTE and the gate insulating film GTI may be placed in the gate trench GTT provided in the first main surface S1. The height $h_5$ of the snubber electrode SNBE in the normal direction (third direction, z direction) of the first main surface S1 may be greater than the height $h_1$ of the gate electrode GTE in the normal direction (third direction, z direction) of the first main surface S1. The snubber electrode SNBE higher than the gate electrode GTE in the normal direction (third direction, z direction) of the first main surface S1 can increase the snubber capacity $C_{snb}$. According to the semiconductor device SC1 of the present embodiment, the snubber portion SNB can further reduce the surge voltage at turn-off of the insulated gate field effect transistor portion MFT and can further suppress the insulated gate field effect transistor portion MFT from being destroyed.

In the semiconductor device SC1 of the present embodiment, the concentration of the first conductivity type impurity in the snubber semiconductor region SNBS may be 1.5 or times that in the drift layer DRF. Such a snubber semiconductor region SNBS can further suppress formation of a depletion region in the snubber semiconductor region SNBS and can further increase the snubber capacity $C_{snb}$. According to the semiconductor device SC1 of the present embodiment, the snubber portion SNB can further reduce the surge voltage at turn-off of the insulated gate field effect transistor portion MFT and further suppress the insulated gate field effect transistor portion MFT from being destroyed.

In the semiconductor device SC1 of the present embodiment, the thickness $t_5$ of the snubber insulating film SNBI may be 1.5 times or more the thickness $t_3$ of the gate insulating film GTI. Such a snubber insulating film SNBI contributes to improvement in the withstand voltage of the snubber portion SNB.

The semiconductor device SC1 of the present embodiment may be the equipped further with an isolation structure SPR that electrically isolates the snubber portion SNB from the insulated gate field effect transistor portion MFT. The isolation structure SPR is located between the insulated gate field effect transistor portion MFT and the snubber portion SNB in the second region PER. The isolation structure SPR contributes to improvement in withstand voltage in the second region PER.

In the semiconductor device SC1 of the present embodiment, the isolation structure SPR may be electrically coupled to the source electrode SCE and at the same time, include the second conductivity type impurity-containing region ICR which is a region containing the second conductivity type impurity. The concentration of the second conductivity type impurity in the second conductivity type impurity-containing region ICR may be smaller than the concentration of the first conductivity type impurity in the drift layer DRF. A depletion region can therefore be formed throughout the isolation structure SPR. The thickness $t_6$ of the second conductivity type impurity-containing region ICR may be equal to or greater than the thickness $t_1$ of the drift layer DRF. The thickness of a depletion region formed in the second conductivity type impurity-containing region ICR becomes equal to or greater than the thickness $t_1$ of the drift layer DRF. Such an isolation structure SPR contributes to further improvement in the withstand voltage in the second region PER.

In the semiconductor device SC1 of the present embodiment, the insulated gate field effect transistor portion MFT may further include at least one second conductivity type semiconductor column SCLM in the drift layer DRF. The insulated gate field effect transistor portion MFT therefore has a superjunction structure having the second conductivity type semiconductor column SCLM and the first conductivity type drift layer DRF arranged alternately. According to the semiconductor device SC1 of the present embodiment, the insulated gate field effect transistor portion MFT has a further improved withstand voltage.

In the semiconductor device SC1 of the present embodiment, the insulated gate field effect transistor portion MFT may further include an insulator column ICLM. At least one semiconductor column SCLM may be placed along the side wall of the column trench CLMT in the drift layer DRF. The insulator column ICLM may be placed in the column trench CLMT. The insulator column ICLM contributes to further improvement in the withstand voltage of the insulated gate field effect transistor portion MFT. The snubber trench SNBT may have a width greater than that of the column trench CLMT. The snubber insulating film SNBI and the insulator column ICLM may therefore be formed in the snubber trench SNBT and the column trench CLMT, respectively, in one step. The semiconductor device SC1 of the present embodiment therefore has a structure that can be formed by the reduced number of steps.

In the semiconductor device SC1 of the present embodiment, the at least one semiconductor column SCLM may be a plurality of semiconductor columns SCLM. The plurality of semiconductor column SCLM may be placed along the side wall of the plurality of column trenches CLMT in the drift layer DRF. The snubber trench SNBT may have a plurality of snubber trench portions SNBTP extending in parallel to each other in the first main surface S1. The distance $g_2$ between the plurality of snubber trench portions SNBTP may be smaller than the distance $g_1$ between the plurality of the column trenches CLMT. The first conductivity type drift layer DRF and the snubber semiconductor region SNBS containing a first conductivity type impurity at a concentration higher than that of the drift layer DRF can be formed in one step.

The method of manufacturing a semiconductor device SC1 according to the present embodiment includes a step of forming an insulated gate field effect transistor portion MFT in a first region ACR of a semiconductor substrate SUB and a step of forming a snubber portion SBN in a second region PER of the semiconductor substrate SUB around the first region ACR. The step of forming an insulated gate field effect transistor portion MFT includes forming a first conductivity type drift layer DRF in the semiconductor substrate SUB, forming a body region BDR and a first conductivity type source region SCR, forming a gate insulating film GTI and a gate electrode GTE, and forming a source electrode SE. The body region BDR is placed on the side of a first main surface S1 of the drift layer DRF in the semiconductor substrate SUB and at the same time, has a second conductivity type which is a conductivity type different from the first conductivity type. The source region SCR is placed on the side of the first main surface S1 of the body region BDR in the semiconductor substrate SUB. The gate insulating film GTI is placed on a portion of the body region BDR sandwiched between the drift layer DRF and the source region SCR. The gate electrode GTE is opposite to a portion of the body region BDR sandwiched between the drift layer DRF and the source region SCR, while having the gate insulating film GTI between them. The step of forming a snubber portion SNB includes forming a first conductivity type snubber semiconductor region SNBS in the semiconductor substrate SUB, forming a snubber trench SNBT on the side of the first main surface S1 of the snubber semiconductor region SNBS, forming a snubber insulating film SNBI in the snubber trench SNBT, and forming a snubber electrode SNBE in the snubber trench SNBT. The snubber electrode SNBE is opposite to the snubber semiconductor region SNBS with the snubber insulating film SNBI therebetween. Forming a source electrode SCE includes electrical coupling of the source electrode SCE to the snubber electrode SNBE. Forming a snubber semiconductor region SNBS includes forming a snubber semiconductor region SNBS so that the snubber semiconductor region SNBS contains a first conductivity type impurity at a concentration higher than that of the drift layer DRF. Forming a snubber insulating film SNBI includes forming a snubber insulating film SNBI so that the snubber insulating film SNBI has, between the snubber semiconductor region SNBS and the snubber electrode SNBE, a thickness $t_5$ greater than the thickness $t_3$ of the gate insulating film GTI between the gate electrode GTE and the body region BDR.

The method of manufacturing a semiconductor device SC1 according to the present embodiment includes forming a snubber semiconductor region SNBS so that the snubber semiconductor region SNBS contains a first conductivity type impurity at a concentration higher than that of the drift layer DRF. Almost no depletion region is therefore formed in the snubber semiconductor region SNBS. The snubber capacity $C_{snb}$, which is a capacity of the snubber portion SNB, substantially consists of the capacity $C_{ox}$ of an insulating film capacitor comprised of the snubber semiconductor region SNBS, the snubber insulating film SNBI, and the snubber electrode SNBE. The snubber semiconductor region SNBS containing a first conductivity type impurity at a concentration higher than that of the drift layer DRF can prevent a decrease in the snubber capacity $C_{snb}$ due to the capacity $C_d$ of a depletion region capacitor (refer to Equation (1)). The method of manufacturing a semiconductor device SC1 according to the present embodiment makes it possible to manufacture the snubber portion SNB capable of reducing a surge voltage at turn-off of the insulated gate field effect transistor portion MFT and at the same time, suppressing the insulated gate field effect transistor portion MFT from being destroyed.

Further, the method of manufacturing a semiconductor device SC1 according to the present embodiment includes forming a snubber insulating film SNBI so that the snubber insulating film SNBI has, between the snubber semiconductor region SNBS and the snubber electrode SNBE, a thickness $t_5$ greater than the thickness $t_3$ of the gate insulating film GTI between the gate electrode GTE and the body region BDR. Even if almost no depletion region is formed in the snubber semiconductor region SNBS, the snubber portion SNB can therefore have an improved withstand voltage comparable to that of the insulated gate field effect transistor portion MFT.

In the method of manufacturing a semiconductor device SC1 according to the present embodiment, the step of forming an insulated gate field effect transistor portion MFT may include forming a gate trench GTT in the first main surface S1 and forming a gate electrode GTE and a gate insulating film GTI in the gate trench GTT. The snubber electrode SNBE may be formed so that the snubber electrode SNBE has a height $h_5$, in the normal direction (third direction, z direction) of the first main surface S1, greater than the height $h_1$ of the gate electrode GTE in the normal direction (third direction, z direction) of the first main surface S1. The snubber electrode SNBE higher than the gate electrode GTE in the normal direction (third direction, z direction) of the first main surface S1 can increase the snubber capacity $C_{snb}$. The method of manufacturing a semiconductor device SC1 according to the present embodiment makes it possible to manufacture a snubber portion SNB capable of further reducing a surge voltage at turn-off of the insulated gate field effect transistor portion MFT and at the same time, further suppressing the insulated gate field effect transistor portion MFT from being destroyed.

The method of manufacturing a semiconductor device SC1 according to the present embodiment may include a step of forming an isolation structure SPR that electrically isolates the snubber portion SNB from the insulated gate field effect transistor portion MFT. The isolation structure SPR is located, in the second region PER, between the insulated gate field effect transistor portion MFT and the snubber portion SNB. The isolation structure SPR contributes to improvement in the withstand voltage in the second region PER.

In the method of manufacturing a semiconductor device SC1 according to the present embodiment, the step of forming an isolation structure SPR includes forming a second conductivity type semiconductor layer SL included in the semiconductor substrate SUB. The step of forming an isolation structure further includes forming a drift layer DRF and a snubber semiconductor region SNBS and thereby forming, between the drift layer DRF and the snubber semiconductor region SNBS, a second conductivity type impurity-containing region ICR containing a second conductivity type impurity. As a result, the second conductivity type impurity-containing region ICR can be manufactured by a reduced number of steps. In the method of manufacturing a semiconductor device SC1 according to the present embodiment, the step of forming an isolation structure SPR further includes forming a source electrode SCE and thereby electrically coupling the second conductivity type impurity-containing region ICR to the source electrode SCE. The concentration of the second conductivity type impurity in the second conductivity type impurity-containing region ICR may be smaller than the concentration of the first conductivity type impurity in the drift layer DRF. A depletion region can therefore be formed throughout the isolation structure SPR. The thickness of the second conductivity type impurity-containing region ICR may be equal to or greater than the thickness of the drift layer DRF. The thickness of the depletion layer formed in the second conductivity type impurity-containing region ICR becomes equal to or greater than the thickness of the drift layer DRF. Such an isolation structure SPR contributes to further improvement in the withstand voltage in the second region PER.

In the method of manufacturing a semiconductor device SC1 according to the present embodiment, the step of forming an insulated gate field effect transistor portion MFT may include forming at least one second conductivity type semiconductor column SCLM in the drift layer DRF. This makes it possible to manufacture an insulated gate field effect transistor portion MFT having a superjunction structure having the second conductivity type semiconductor column SCLM and the first conductivity type drift layer DRF arranged alternately. By the method of manufacturing a semiconductor device SC1 according to the present embodiment, an insulated gate field effect transistor portion MFT having a further improved withstand voltage can be manufactured.

In the method of manufacturing a semiconductor device SC1 according to the present embodiment, forming at least one semiconductor column SCLM may include forming a column trench CLMT in the drift layer DRF and forming at least one semiconductor column SCLM along the side wall of the column trench CLMT. Forming a snubber trench SNBT may include forming a snubber trench SNBT so that the snubber trench SNBT has a width greater than that of the column trench CLMT. The step of forming an insulated gate field effect transistor portion MFT may be performed in one step with the step of forming a snubber insulating film SNBI in the snubber trench SNBT and it may include forming an insulator column ICLM in the column trench CLMT. The snubber insulating film SNBI and the insulator column ICLM may be formed in the snubber trench SNBT and the column trenches CLMT, respectively, by one step. In the method of manufacturing a semiconductor device SC1 according to the present embodiment, the semiconductor device SC1 can be manufactured by a reduced number of steps.

In the method of manufacturing a semiconductor device SC1 according to the present embodiment, forming at least one semiconductor column SCLM may be forming not one but a plurality of semiconductor columns SCLM. Forming a plurality of semiconductor columns SCLM includes forming a plurality of column trenches CLMT in the semiconductor layer SL included in the semiconductor substrate SUB and forming a plurality of semiconductor columns SCLM along the side wall of the plurality of column trenches CLMT. Forming a snubber trench SNBT may include forming a plurality of snubber trench portions SNBTP extending in parallel to each other in the first main surface S1. The plurality of snubber trench portions SNBTP may be formed so that a distance $g_2$ between the plurality of snubber trench portions SNBTP becomes smaller than a distance $g_1$ between the plurality of column trenches CLMT. Forming a drift layer DRF and a snubber semiconductor region SNBS may include doping the side wall of the plurality of column trenches CLMT and the side wall of the snubber trench portions SNBTP with a first conductivity type impurity and diffusing the first conductivity type impurity into the semiconductor layer SL. Since the distance $g_2$ between the plurality of snubber trench portions SNBTP is smaller than the distance $g_1$ between the plurality of column trenches CLMT, the first conductivity type drift layer DRF and the snubber semiconductor region SNBS containing the first conductivity type impurity at a concentration higher than that of the drift layer DRF may be formed in one step. In the method of manufacturing a semiconductor device SC1 according to the present embodiment, the semiconductor device SC1 can be manufactured by a reduced number of steps.

A modification example of the semiconductor device SC1 and the manufacturing method thereof according to the present embodiment will next be described. In the semiconductor device SC1 and the manufacturing method thereof according to the present embodiment, the insulated gate field effect transistor portion MFT may be, for example, an IGBT (insulated gate bipolar transistor). When the insulated gate field effect transistor portion MFT is an IGBT, the drain electrode DRE may be a collector electrode. In the semiconductor device SC1 and manufacturing method thereof according to the present embodiment, the substrate region SBR may be omitted. In the semiconductor device SC1 and manufacturing method thereof according to the present embodiment, the semiconductor layer SL may have a first conductivity type. In the method of manufacturing a semiconductor device SC1 according to the present embodiment, the snubber trench SNBT and the column trench CLMT may be formed by respectively different steps. In the method of manufacturing a semiconductor device SC1 according to the present embodiment, the snubber insulating film SNBI and the insulator column ICLM may be formed by respectively different steps. In the semiconductor device SC1 and manufacturing method thereof according to the present embodiment, the semiconductor column SCLM, the insulator column ICLM, and the column trench CLMT of the insulated gate field effect transistor portion MFT may be omitted. In the semiconductor device SC1 and manufacturing method thereof according to the present embodiment, layers, regions, and portions configuring the semiconductor device SC1 may have a conductivity type opposite to that described above.

(Second Embodiment)

The configuration of a semiconductor device SC2 of the present embodiment will next be described referring to FIG. 7 and FIGS. 20 to 22. The semiconductor device SC2 of the present embodiment shown in FIG. 7 and FIGS. 20 to 22 has a configuration similar to that of the semiconductor device SC1 of First Embodiment shown in FIGS. 4 to 7, but is different mainly in the following points.

The semiconductor device SC2 of the present embodiment lacks the column trench CLMT and the insulator column ICLM. The thickness $t_1$ of the drift layer DRF of the present embodiment is smaller than the thickness $t_2$ of the drift layer DRF of First Embodiment. The semiconductor device SC2 of the present embodiment has a withstand voltage smaller than that of the semiconductor device SC1 of First Embodiment.

A method of manufacturing a semiconductor device SC2 according to the present embodiment will be described referring to FIG. 20 and FIGS. 23 to 33. The method of manufacturing a semiconductor device SC2 according to the present embodiment has steps similar to those of the method of manufacturing a semiconductor device SC1 according to First Embodiment, but is different mainly in the following points.

Figure 23:
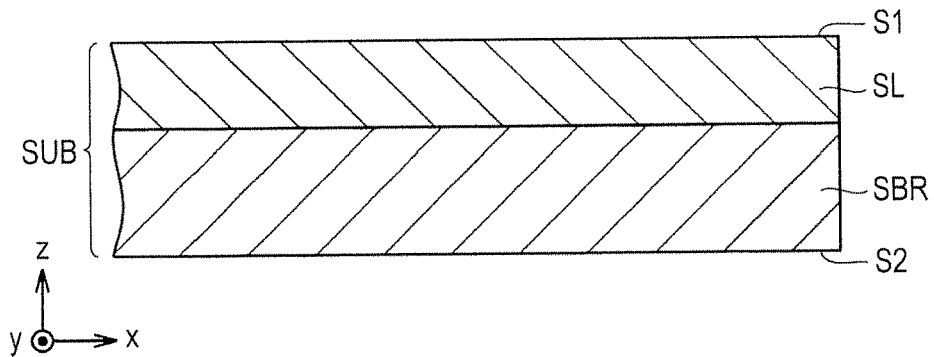
FIG. 23 is a schematic cross-sectional view showing a step of a manufacturing method of a semiconductor device according to Second Embodiment and Third Embodiment.

Referring to FIG. 23, the method of manufacturing a semiconductor device SC2 according to the present embodiment has a step of providing a semiconductor substrate SUB having a first main surface S1 and a second main surface S2 opposite to each other. The step of providing a semiconductor substrate SUB in the present embodiment is similar to the step of providing the semiconductor substrate SUB in First Embodiment shown in FIG. 8 but is different in the following point. The thickness of the semiconductor layer SL of the present embodiment in the normal direction (third direction, z direction) of the first main surface S1 is smaller than that of the semiconductor layer SL of First Embodiment in the normal direction (third direction, z direction) of the first main surface S1.

Figure 24:
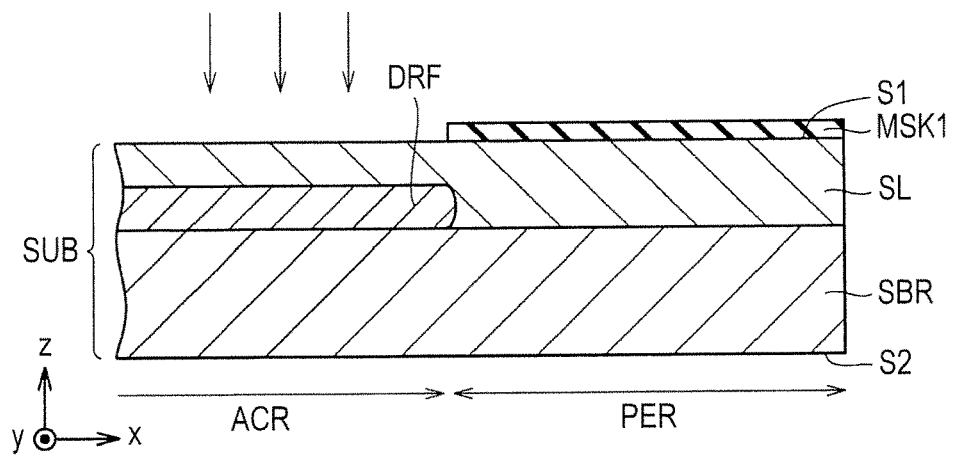
FIG. 24 is a schematic cross-sectional view showing a step, following that shown in FIG. 23, in the method of manufacturing a semiconductor device according to Second Embodiment and Third Embodiment.
Figure 25:
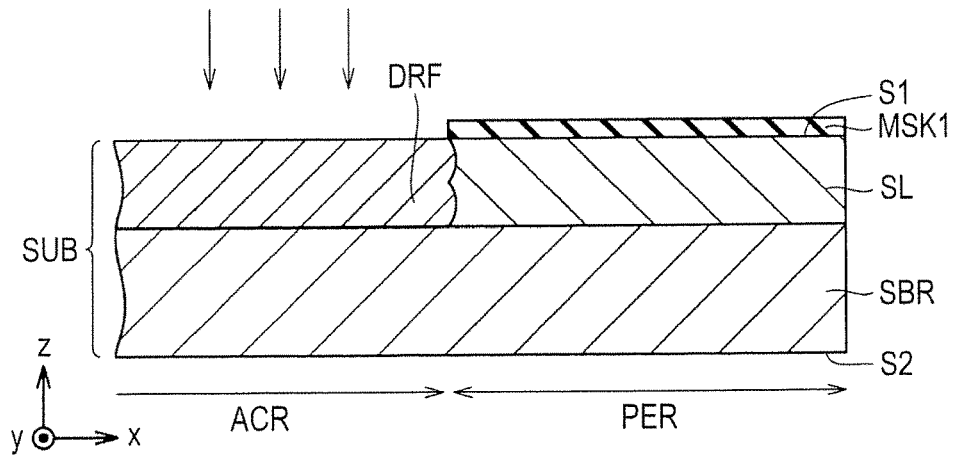
FIG. 25 is a schematic cross-sectional view showing a step, following that shown in FIG. 24, in the method of manufacturing a semiconductor device according to Second Embodiment and Third Embodiment.

Referring to FIGS. 24 and 25, the method of manufacturing a semiconductor device SC2 according to the present embodiment has a step of forming a first conductivity type drift layer DRF in the semiconductor substrate SUB. More specifically, referring to FIG. 24, a first mask MSK1 having an opening portion is formed on the first main surface S1 of the semiconductor substrate SUB. The first mask MSK1 may be made of, for example, silicon dioxide or a photoresist. A first conductivity type impurity is implanted into the semiconductor substrate SUB (a second conductivity type semiconductor layer SL) along the normal direction (−z direction) of the first main surface S1 at a relatively high energy. For example, arsenic or antimony is ion-implanted into the second conductivity type semiconductor layer SL at a relatively high energy. Thus, a first conductivity type drift layer DRF is formed in a relatively deep region in the semiconductor layer SL. Referring to FIG. 25, a first conductivity type impurity is implanted into the semiconductor substrate SUB (the second conductivity type semiconductor layer SL) along the normal direction (−z direction) of the first main surface S1 at a relatively low energy. Then, a first conductivity type drift layer DRF is formed in a relatively shallow region in the semiconductor layer SL. In such a manner, the first conductivity type drift layer DRF is formed by doping the first conductivity type impurity from the first main surface S1 of the semiconductor layer SL into the semiconductor layer SL. The thickness of the semiconductor layer SL of the present embodiment in the normal direction (third direction, z direction) of the first main surface S1 is smaller than that of the semiconductor layer SL of First Embodiment in the normal direction (third direction, z direction) of the first main surface S1. The drift layer DRF can therefore be formed precisely by ion implantation. The doping frequency of the first conductivity type impurity into the semiconductor layer SL for the formation of the drift layer DRF is not limited to twice but can be determined voluntarily.

Figure 26:
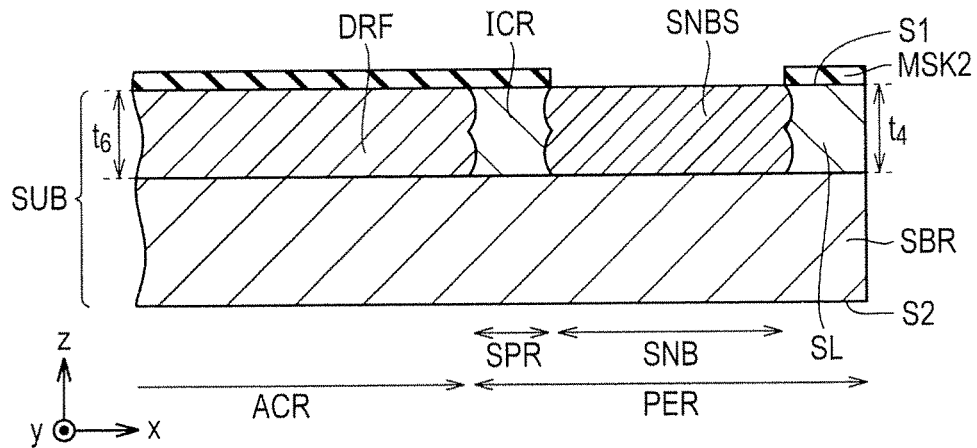
FIG. 26 is a schematic cross-sectional view showing a step, following that shown in FIG. 25, in the method of manufacturing a semiconductor device according to Second Embodiment and Third Embodiment.

Referring to FIG. 26, the method of manufacturing a semiconductor device according to the present embodiment includes a step of forming a first conductivity type snubber semiconductor region SNBS in the semiconductor substrate SUB. More specifically, a second mask MSK2 having an opening portion is formed on the first main surface S1 of the semiconductor substrate SUB. The second mask MSK2 may be made of, for example, silicon dioxide or a photoresist. By steps similar to those shown in FIGS. 24 and 25, a first conductivity type impurity is ion-implanted into the semiconductor substrate SUB (second conductivity type semiconductor layer SL) at a relatively high energy and at a relatively low energy. The first conductivity type impurity is implanted into the second conductivity type semiconductor layer SL so that the snubber semiconductor region SNBS has a first conductivity type impurity concentration greater than that in the drift layer DRF. In such a manner, the first conductivity type snubber semiconductor region SNBS is formed by doping the first conductivity type impurity from the first main surface S1 of the semiconductor layer SL into the semiconductor layer SL. Then, the first conductivity type impurity contained in the drift layer DRF and the snubber semiconductor region SNBS are activated, for example, by heat treatment at a temperature of 1000° C. or more but not more than 1200° C.

The snubber semiconductor region SNBS has a thickness $t_4$ in the third direction (z direction). The snubber semiconductor region SNBS may have a thickness equal to that of the semiconductor layer SL. The thickness of the semiconductor layer SL of the present embodiment in the normal direction (third direction, z direction) of the first main surface S1 is smaller than the thickness of the semiconductor layer SL of First Embodiment in the normal direction of the first main surface S1. The snubber semiconductor region SNBS can therefore be formed with good precision by ion implantation.

The method of manufacturing a semiconductor device SC2 according to the present embodiment includes forming a second conductivity type impurity-containing region ICR between the drift layer DRF and the snubber semiconductor region SNBS in the semiconductor substrate SUB. By forming the drift layer DRF and the snubber semiconductor region SNBS, the second conductivity type impurity-containing region ICR containing a second conductivity type impurity may be formed between the drift layer DRF and the snubber semiconductor region SNBS. More specifically, by forming the drift layer DRF and the snubber semiconductor region SNBS in a portion of the second conductivity type semiconductor layer, the second conductivity type impurity-containing region ICR containing the second conductivity type impurity may be formed between the drift layer DRF and the snubber semiconductor region SNBS. The second conductivity type impurity-containing region ICR may be a second conductivity type semiconductor layer SL between the drift layer DRF and the snubber semiconductor region SNBS. The second conductivity type impurity-containing region ICR has a thickness $t_6$ in the third direction (z direction). The second conductivity type impurity-containing region ICR may have a thickness equal to that of the semiconductor layer SL. The concentration of the second conductivity type impurity in the second conductivity type impurity-containing region ICR may be smaller than the concentration of the first conductivity type impurity in the drift layer DRF.

Figure 27:
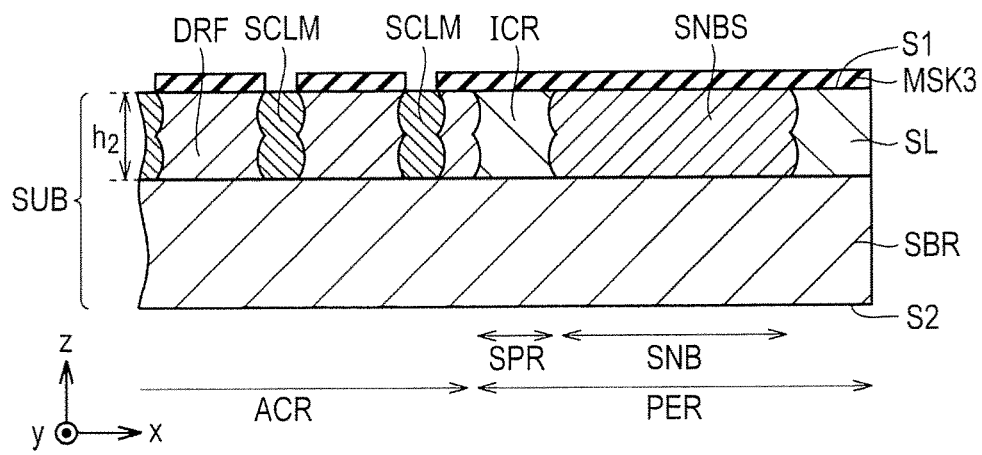
FIG. 27 is a schematic cross-sectional view showing a step, following that shown in FIG. 26, in the method of manufacturing a semiconductor device according to Second Embodiment and Third Embodiment.

Referring to FIG. 27, the method of manufacturing a semiconductor device SC2 according to the present embodiment has a step of forming at least one second conductivity type semiconductor column SCLM in the drift layer DRF. Forming at least one semiconductor column SCLM includes doping the drift layer DRF with a second conductivity type impurity. More specifically, a third mask having an opening portion is formed on the first main surface S1 of the semiconductor substrate SUB. The third mask may be made of, for example, silicon dioxide or a photoresist. By steps similar to those shown in FIGS. 24 and 25, the second conductivity type impurity is ion-implanted into the drift layer DRF at a relatively high energy and at a relatively low energy. In such a manner, the second conductivity type semiconductor column SCLM is formed by doping the second conductivity type impurity from the first main surface S1 of the semiconductor layer SL into the semiconductor layer SL. Then, heat treatment is performed at a temperature of 800° C. or more but not more than 900° C. to activate the second conductivity type impurity contained in the semiconductor column SCLM.

The at least one semiconductor column SCLM has a height $h_2$ in the third direction (z direction). The at least one semiconductor column SCLM may have a thickness equal to that of the semiconductor layer SL. The thickness of the semiconductor layer SL of the present embodiment in the normal direction (third direction, z direction) of the first main surface S1 is smaller than the thickness of the semiconductor layer SL of First Embodiment in the normal direction (third direction, z direction) of the first main surface S1. The second conductivity type semiconductor column SCLM can therefore be formed with good precision by ion implantation. A superjunction structure is formed in which the second conductivity type semiconductor column SCLM and the first conductivity type drift layer DRF are alternately arranged in the first direction (x direction).

Figure 28:
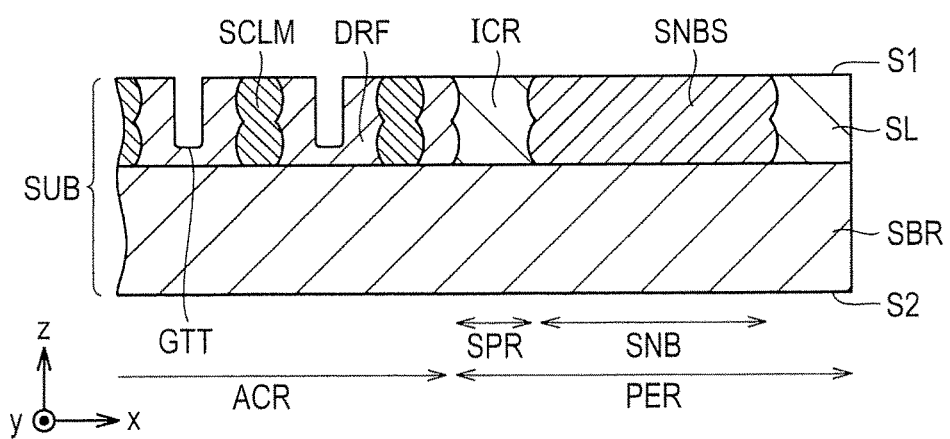
FIG. 28 is a schematic cross-sectional view showing a step, following that shown in FIG. 27, in the method of manufacturing a semiconductor device according to Second Embodiment.
Figure 29:
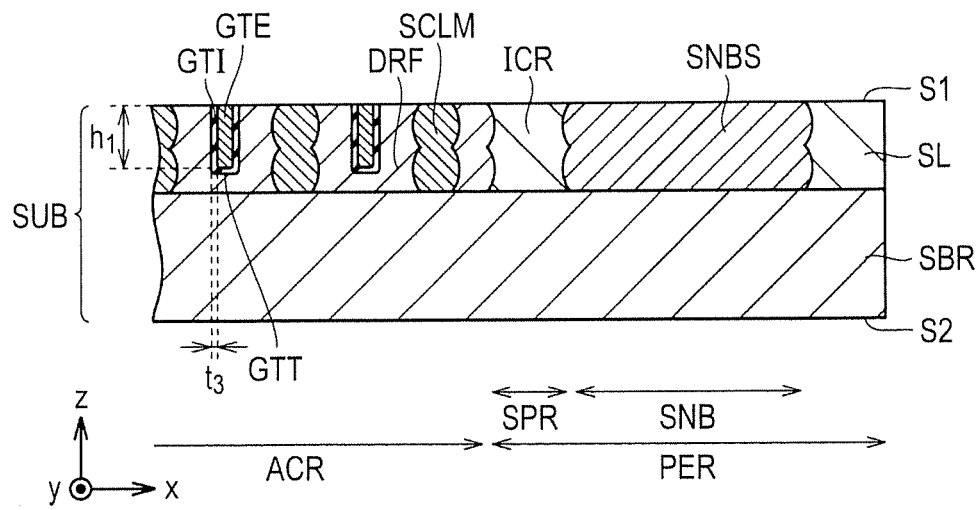
FIG. 29 is a schematic cross-sectional view showing a step, following that shown in FIG. 28, in the method of manufacturing a semiconductor device according to Second Embodiment.

Referring to FIGS. 28 and 29, the method of manufacturing a semiconductor device SC2 according to the present embodiment has a step of forming a gate insulating film GTI and a gate electrode GTE. The step of forming a gate trench GTT of the present embodiment shown in FIG. 28 is similar to the step of forming the gate trench GTT of First Embodiment shown in FIG. 9. The step of forming a gate insulating film GTI and a gate electrode GTE according to the present embodiment shown in FIG. 29 is similar to the step of forming a gate insulating film GTI and a gate electrode GTE according to First Embodiment shown in FIG. 10.

Figure 30:
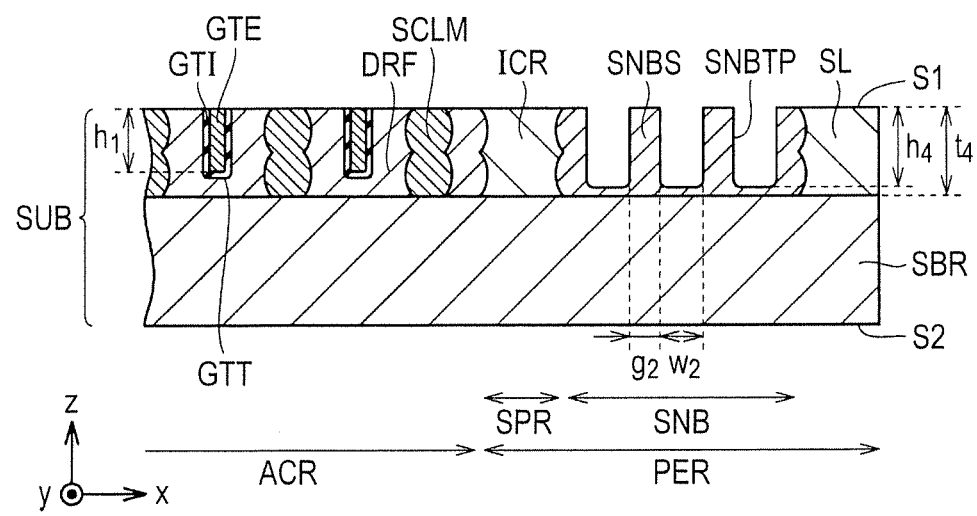
FIG. 30 is a schematic cross-sectional view showing a step, following that shown in FIG. 29, in the method of manufacturing a semiconductor device according to Second Embodiment.

Referring to FIG. 30, the method of manufacturing a semiconductor device SC2 according to the present embodiment has a step of forming a snubber trench SNBT (refer to FIG. 3) on the side of the first main surface S1 of the snubber semiconductor region SNBS. The snubber trench SNBT may be formed, for example, by anisotropic etching of the snubber semiconductor region SNBS. Forming a snubber trench SNBT may include forming a plurality of snubber trench portions SNBTP extending in parallel to each other in the first main surface S1. The height $h_4$ of the snubber trench portions SNBTP (snubber trench SNBT) may be greater than the height $h_1$ of the gate electrode GTE. The height $h_4$ of the snubber trench portions SNBTP (snubber trench SNBT) may be 0.5 times or more, preferably 0.7 times or more, more preferably 0.8 times or more the thickness $t_4$ of the snubber semiconductor region SNBS.

Figure 31:
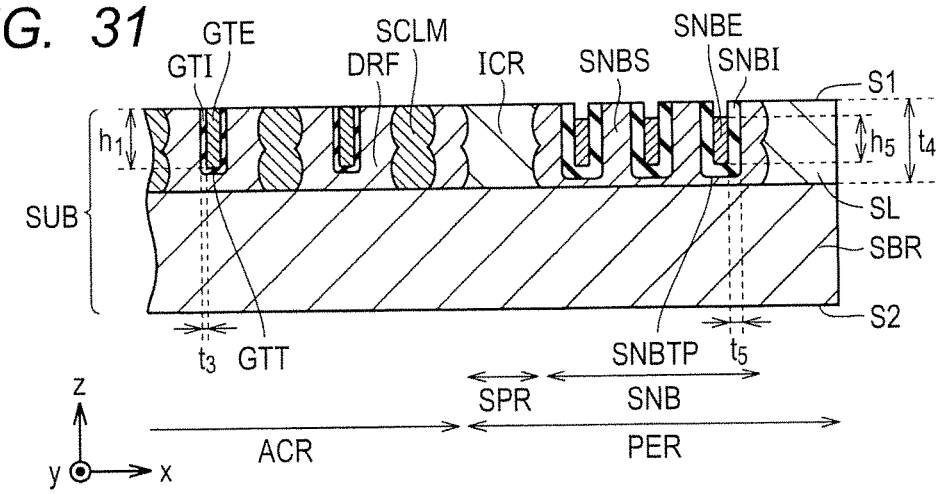
FIG. 31 is a schematic cross-sectional view showing a step, following that shown in FIG. 30, in the method of manufacturing a semiconductor device according to Second Embodiment.

Referring to FIG. 31, the method of manufacturing a semiconductor device SC2 according to the present embodiment includes forming a snubber insulating film SNBI and a snubber electrode SNBE in the snubber trench SNBT. The snubber electrode SNBE is formed in the snubber trench SNBT so as to be opposite to the snubber semiconductor region SNBS with the snubber insulating film SNBI therebetween. The step of forming a snubber insulating film SNBI and a snubber electrode SNBE according to the present embodiment shown in FIG. 31 is similar to the steps of forming a snubber insulating film SNBI and a snubber electrode SNBE according to First Embodiment shown in FIGS. 16 and 17.

Figure 32:
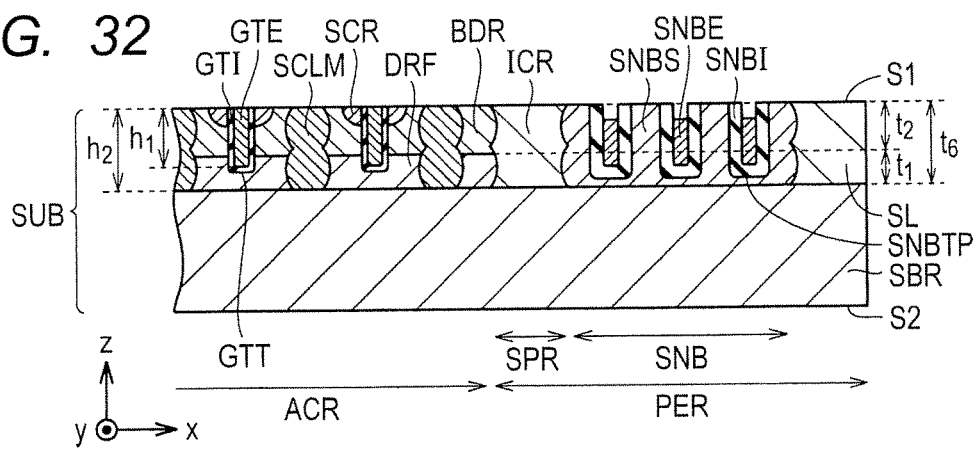
FIG. 32 is a schematic cross-sectional view showing a step, following that shown in FIG. 31, in the method of manufacturing a semiconductor device according to Second Embodiment.

Referring to FIG. 32, the method of manufacturing a semiconductor device SC2 according to the present embodiment includes forming a body region BDR and a first conductivity type source region SCR. The step of forming a body region BDR and a source region SCR according to the present embodiment shown in FIG. 32 is similar to the step of forming a body region BDR and a source region SCR according to First Embodiment shown in FIG. 18.

Figure 33:
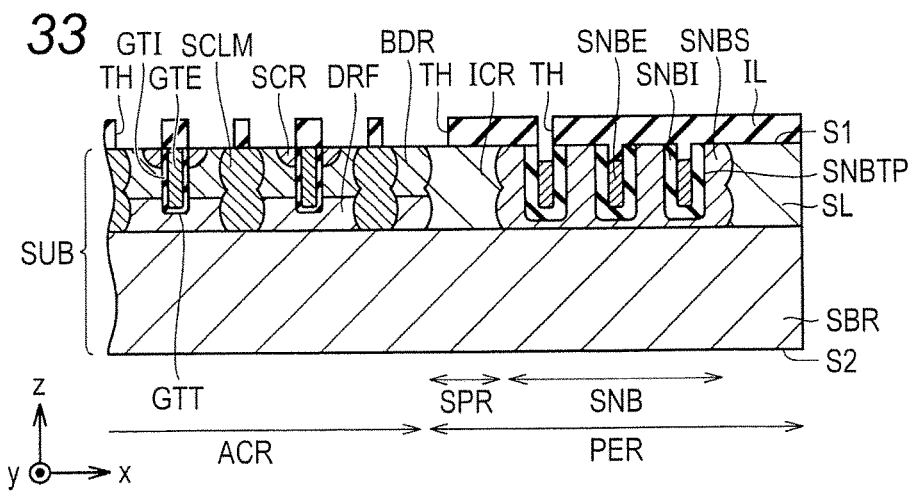
FIG. 33 is a schematic cross-sectional view showing a step, following that shown in FIG. 32, in the method of manufacturing a semiconductor device according to Second Embodiment.
Figure 34:
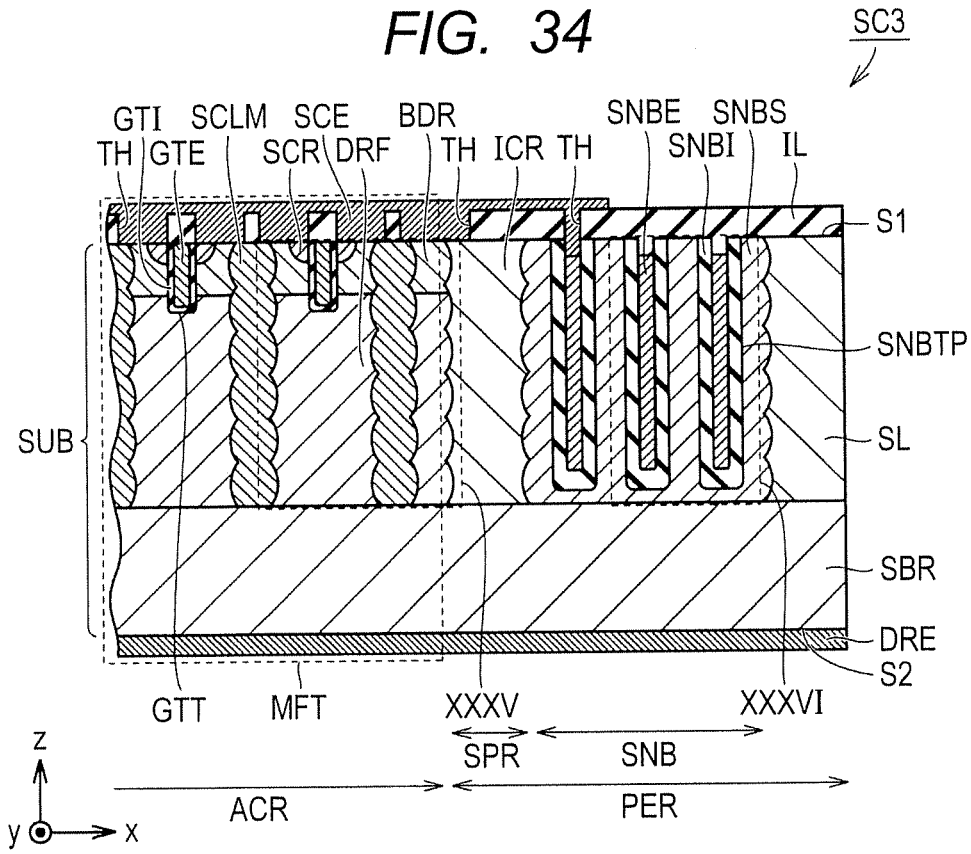
FIG. 34 is a schematic cross-sectional view of a semiconductor device according to Third Embodiment.
Figure 35:
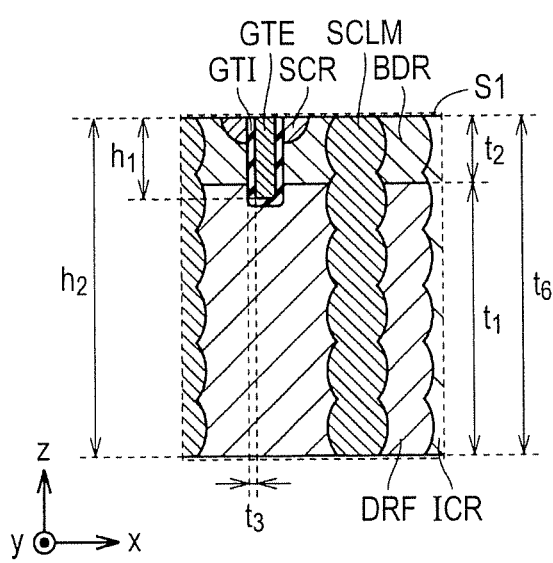
FIG. 35 is a schematic enlarged cross-sectional view of the region XXXV, shown in FIG. 34, of the semiconductor device according to Third Embodiment.
Figure 36:
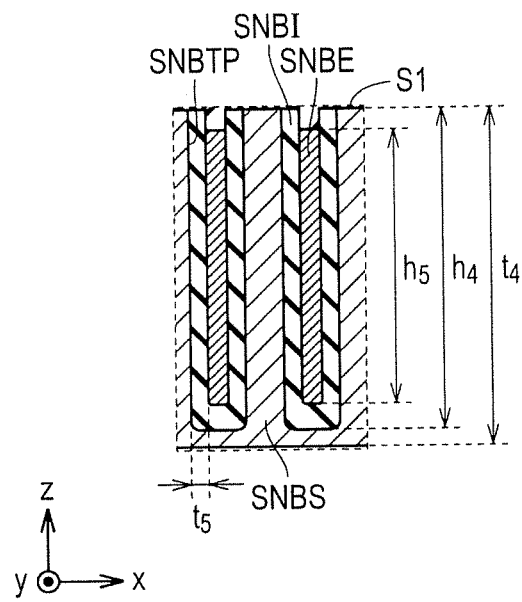
FIG. 36 is a schematic enlarged cross-sectional view of the region XXXVI, shown in FIG. 34, of the semiconductor device according to Third Embodiment.

Referring to FIG. 33, the method of manufacturing a semiconductor device SC2 according to the present embodiment may include forming an interlayer insulating film IL having a through-hole TH on the first main surface S1 of the semiconductor substrate SUB. The step of forming an interlayer insulating film IL according to the present embodiment shown in FIG. 33 is similar to the step of forming an interlayer insulating film IL according to First Embodiment shown in FIG. 19. The method of manufacturing a semiconductor device SC2 according to the present embodiment may include forming a source electrode SCE on the first main surface S1 of the semiconductor substrate SUB and forming a drain electrode DRE on the second main surface S2 of the semiconductor substrate SUB. The step of forming a source electrode SCE and a drain electrode DRE according to the present embodiment is similar to that of forming a source electrode SCE and a drain electrode DRE according to First Embodiment. By the above-described steps, the semiconductor device SC2 of the present embodiment shown in FIG. 20 can be manufactured.

The effect and advantage of the present embodiment will next be described. The present embodiment has an effect and an advantage similar to those of First Embodiment but is different mainly in the following point.

In the method of manufacturing a semiconductor device SC2 according to the present embodiment, forming a drift layer DRF and a snubber semiconductor region SNBS may include forming a semiconductor layer SL included in the semiconductor substrate SUB and doping a first conductivity type impurity from the first main surface S1 of the semiconductor layer SL into the semiconductor layer SL. In the method of manufacturing a semiconductor device SC2 according to the present embodiment, the drift layer DRF can be formed without forming the column trench CLMT of First Embodiment. Forming a semiconductor column SCLM may include doping the second conductivity type impurity from the first main surface S1 of the drift layer DRF into the drift layer DRF. In the method of manufacturing a semiconductor device SC2 according to the present embodiment, the semiconductor column SCLM can be formed without doping the second conductivity type impurity in a direction inclined relative to the normal line of the first main surface S1.

The semiconductor device SC2 and manufacturing method thereof according to the present embodiment can be modified as in the modification example of the semiconductor device SC1 and manufacturing method thereof according to First Embodiment.

(Third Embodiment)

The configuration of a semiconductor device SC3 of the present embodiment will next be described referring to FIG. 7 and FIGS. 34 to 36. The semiconductor device SC3 of the present embodiment has a configuration similar to that of the semiconductor device SC2 of Second Embodiment shown in FIG. 7 and FIGS. 20 to 22 but is different mainly in the following point.

The thickness $t_1$ of a drift layer DRF, the thickness $t_4$ of a snubber semiconductor region SNBS, the height $h_2$ of a semiconductor column SCLM, the height $h_4$ of a snubber insulating film SNBI, the height $h_4$ of a snubber trench SNBT, the height $h_5$ of a snubber electrode SNBE, the thickness $t_4$ of a second conductivity type impurity-containing region ICR, and the thickness of a semiconductor layer SL in the present embodiment are greater than those of Second Embodiment, respectively.

The method of manufacturing a semiconductor device SC3 according to the present embodiment will be described referring to FIGS. 23 to 27, FIG. 34, and FIGS. 37 to 43. The method of manufacturing a semiconductor device according to the present embodiment has steps similar to those of the method of manufacturing a semiconductor device SC2 according to Second Embodiment, but is different mainly in the following point.

In the present embodiment, forming a drift layer DRF and a snubber semiconductor region SNBS shown in FIGS. 23 to 26 and forming a semiconductor column SCLM shown in FIG. 27 are repeated. This makes it possible to make the thickness $t_1$ of the drift layer DRF, the height $h_2$ of the semiconductor column SCLM, the height $h_4$ of the snubber insulating film SNBI, the thickness $t_4$ of the snubber semiconductor region SNBS, the height $h_5$ of the snubber electrode SNBE, and the thickness $t_4$ of the second conductivity type impurity-containing region ICR greater than those of Second Embodiment, respectively. The drift layer DRF, the semiconductor column SCLM, the snubber insulating film SNBI, the snubber semiconductor region SNBS, the snubber electrode SNBE, and the second conductivity type impurity-containing region ICR can be formed with good precision.

Figure 37:
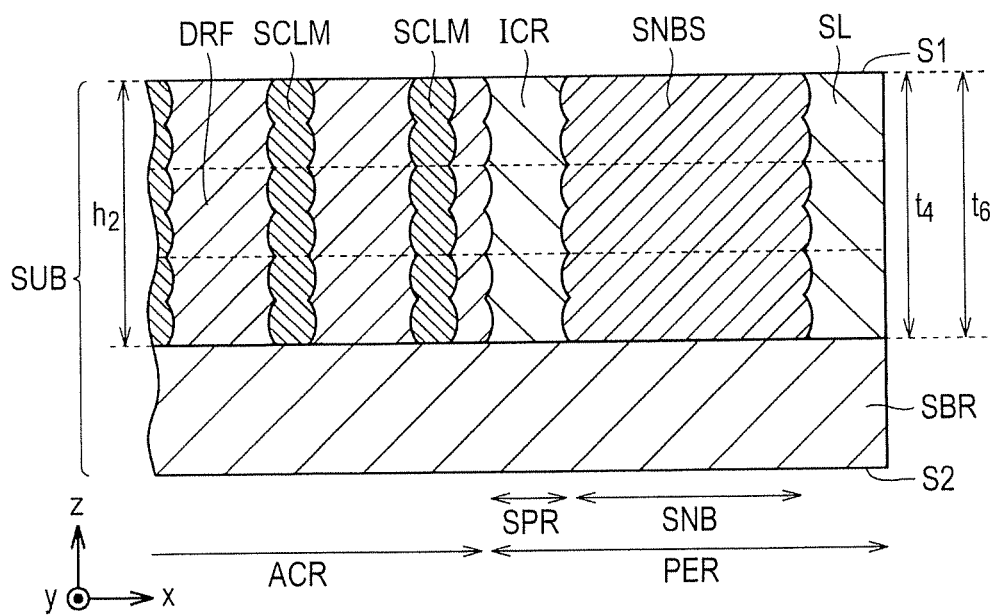
FIG. 37 is a schematic cross-sectional view showing a step of the method of manufacturing a semiconductor device according to Third Embodiment.

More specifically, by steps similar to those shown in FIGS. 23 to 27, a first-stage drift layer DRF, snubber semiconductor region SNBS, second conductivity type impurity-containing region ICR, and semiconductor column SCLM are formed. Then, a step of depositing a second conductivity type semiconductor layer SL shown in FIG. 23, a step of forming a drift layer DRF shown in FIGS. 24 and 25, a step of forming a snubber semiconductor region SNBS and a second conductivity type impurity-containing region ICR shown in FIG. 26, and a step of forming a semiconductor column SCLM shown in FIG. 27 are performed again to form a second-stage drift layer DRF, snubber semiconductor region SNBS, second conductivity type impurity-containing region ICR, and semiconductor column SCLM are formed. Steps shown in FIGS. 23 to 27 are then performed again to form a third-stage drift layer DRF, snubber semiconductor region SNBS, second conductivity type impurity-containing region ICR, and semiconductor column SCLM. In such a manner, the drift layer DRF, the snubber semiconductor region SNBS, the second conductivity type impurity-containing region ICR, and the semiconductor column SCLM shown in FIG. 37 are formed.

The snubber semiconductor region SNBS has a thickness $t_4$ in the third region (z direction). The snubber semiconductor region SNBS may have a thickness equal to that of the semiconductor layer SL. At least one semiconductor column SCLM has a height $h_2$ in the third direction (z direction). The at least one semiconductor column SCLM may have a thickness equal to that of the semiconductor layer SL. The second conductivity type impurity-containing region ICR has a thickness $t_6$ in the third direction (z direction). The second conductivity type impurity-containing region ICR may have a thickness equal to that of the semiconductor layer SL. The steps shown in FIGS. 23 to 27 are performed not only three times, but the frequency can be determined voluntarily, depending on the designed withstand voltage of the semiconductor device SC3. A superjunction structure is thus formed in which the second conductivity type semiconductor column SCLM and the first conductivity type drift layer DRF are alternately arranged in the first direction (x direction).

Figure 38:
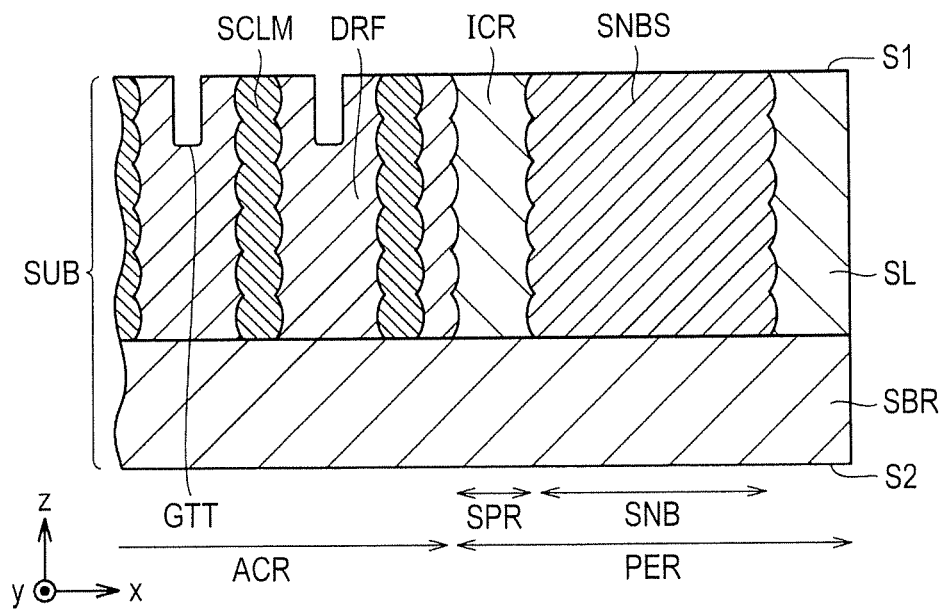
FIG. 38 is a schematic cross-sectional view showing a step, following that shown in FIG. 37, in the method of manufacturing a semiconductor device according to Third Embodiment.
Figure 39:
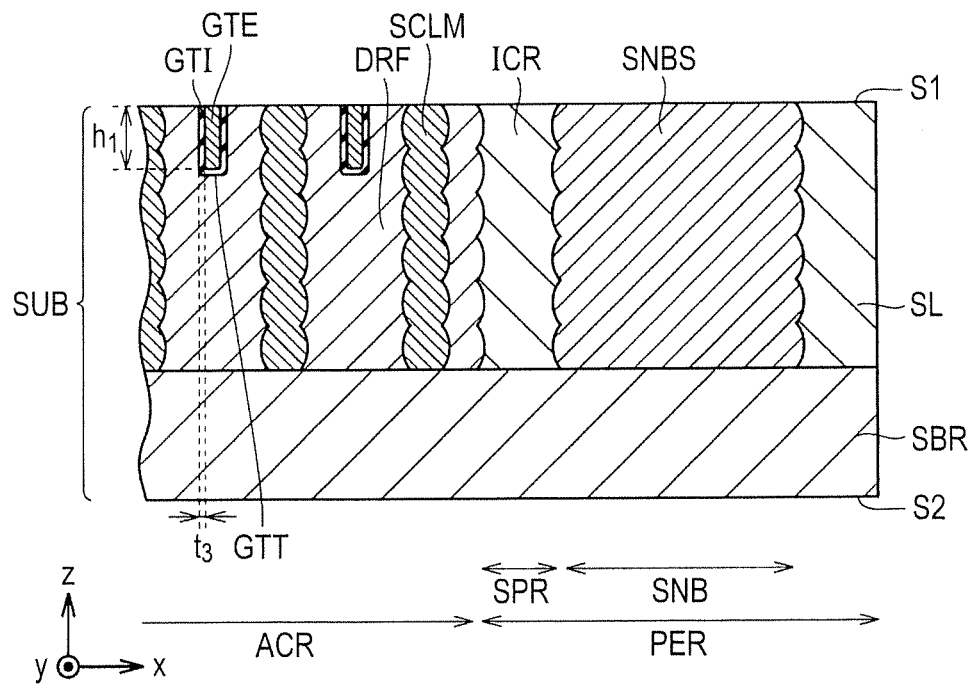
FIG. 39 is a schematic cross-sectional view showing a step, following that shown in FIG. 38, in the method of manufacturing a semiconductor device according to Third Embodiment.

Referring to FIGS. 38 and 39, the method of manufacturing a semiconductor device SC3 according to the present embodiment includes a step of forming a gate insulating film GTI and a gate electrode GTE. A step of forming a gate trench GTT according to the present embodiment shown in FIG. 38 is similar to the step of forming a gate trench GTT according to Second Embodiment shown in FIG. 28. The step of forming a gate insulating film GTI and a gate electrode GTE according to the present embodiment shown in FIG. 39 is similar to the step of forming a gate insulating film GTI and a gate electrode GTE according to Second Embodiment shown in FIG. 29.

Figure 40:
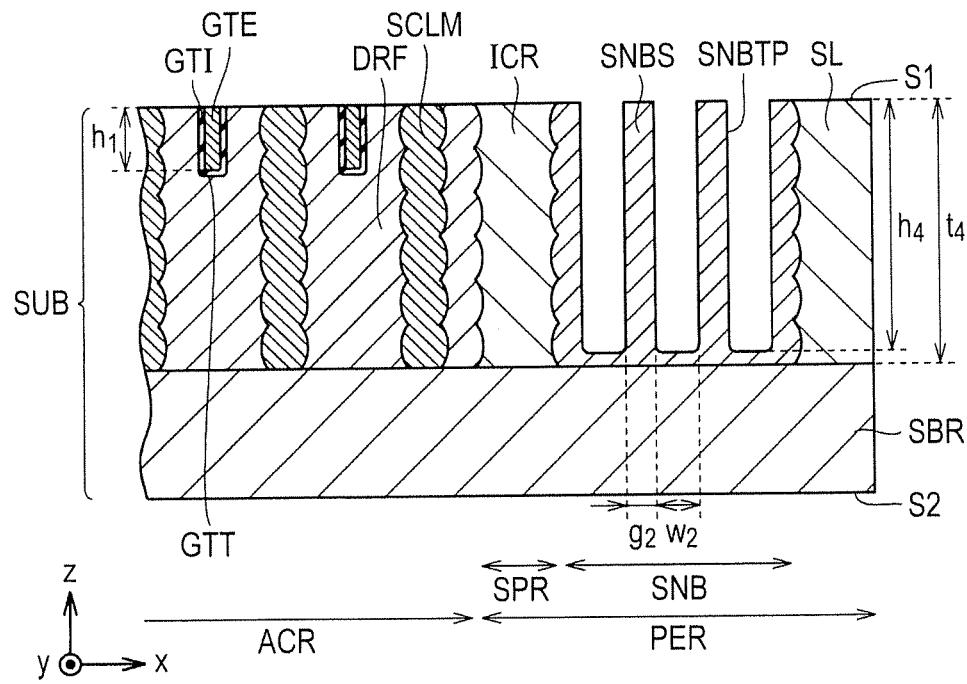
FIG. 40 is a schematic cross-sectional view showing a step, following that shown in FIG. 39, in the method of manufacturing a semiconductor device according to Third Embodiment.

Referring to FIG. 40, the method of manufacturing the semiconductor device SC3 according to the present embodiment includes a step of forming a snubber trench SNBT (refer to FIG. 3) on the side of the first main surface S1 of the snubber semiconductor region SNBS. The step of forming a snubber trench SNBT according to the present embodiment shown in FIG. 40 is similar to the step of forming a snubber trench SNBT according to Second Embodiment shown in FIG. 30. Forming a snubber trench SNBT may include forming a plurality of snubber trench portions SNBTP extending in parallel to each other in the first main surface S1. The height $h_4$ of the snubber trench portions SNBTP (snubber trench SNBT) may be greater than the height $h_1$ of the gate electrode GTE. The height $h_4$ of the snubber trench portions SNBTP (snubber trench SNBT) may be 0.5 times or more, preferably 0.7 times or more, more preferably 0.8 times or more the thickness $t_4$ of the snubber semiconductor region SNBS.

Figure 41:
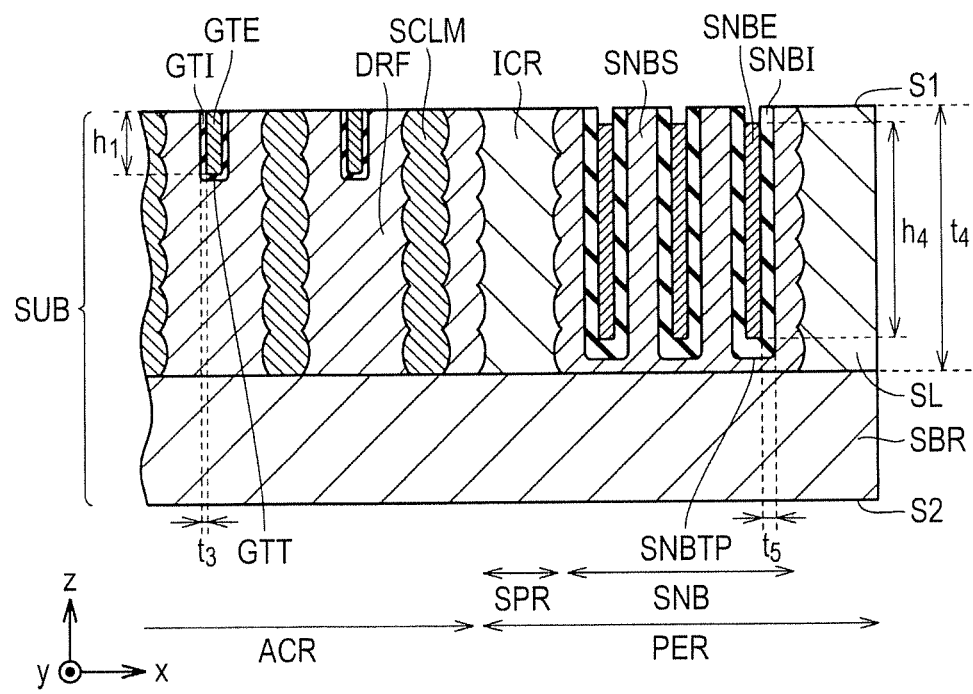
FIG. 41 is a schematic cross-sectional view showing a step, following that shown in FIG. 40, in the method of manufacturing a semiconductor device according to Third Embodiment.

Referring to FIG. 41, the method of manufacturing a semiconductor device SC3 according to the present embodiment includes forming a snubber insulating film SNBI and a snubber electrode SNBE in the snubber trench SNBT. The step of forming a snubber insulating film SNBI and a snubber electrode SNBE according to the present embodiment is similar to that of forming a snubber insulating film SNBI and a snubber electrode SNBE according to Second Embodiment shown in FIG. 31.

Figure 42:
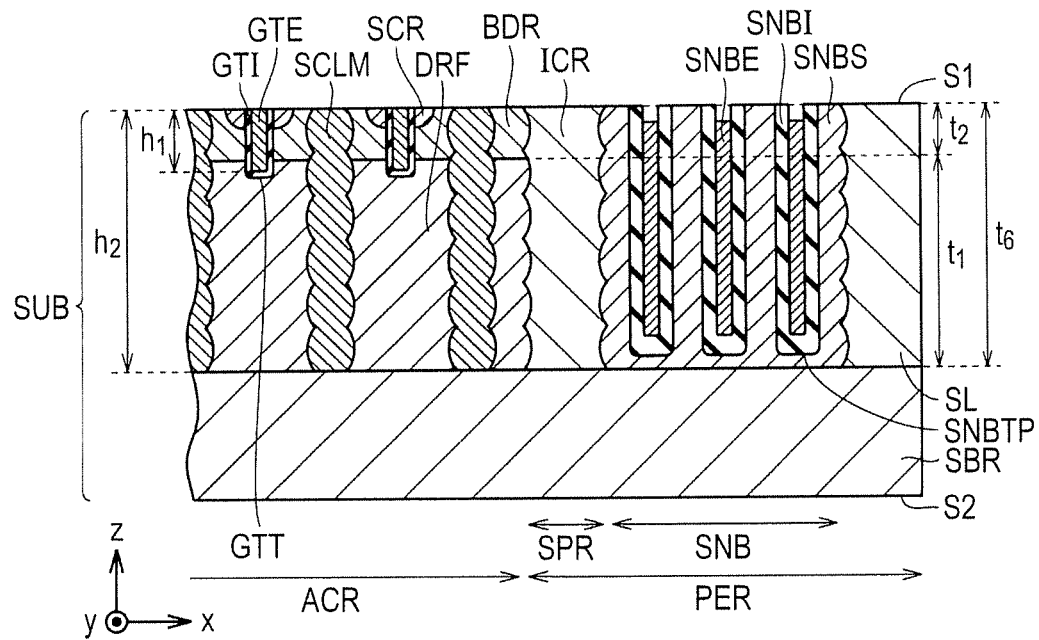
FIG. 42 is a schematic cross-sectional view showing a step, following that shown in FIG. 41, in the method of manufacturing a semiconductor device according to Third Embodiment.

Referring to FIG. 42, the method of manufacturing a semiconductor device SC3 according to the present embodiment includes forming a body region BDR and a first conductivity type source region SCR. The step of forming a body region BDR and a source region SCR according to the present embodiment shown in FIG. 42 is similar to the step of forming a body region BDR and a source region SCR according to Second Embodiment shown in FIG. 32.

Figure 43:
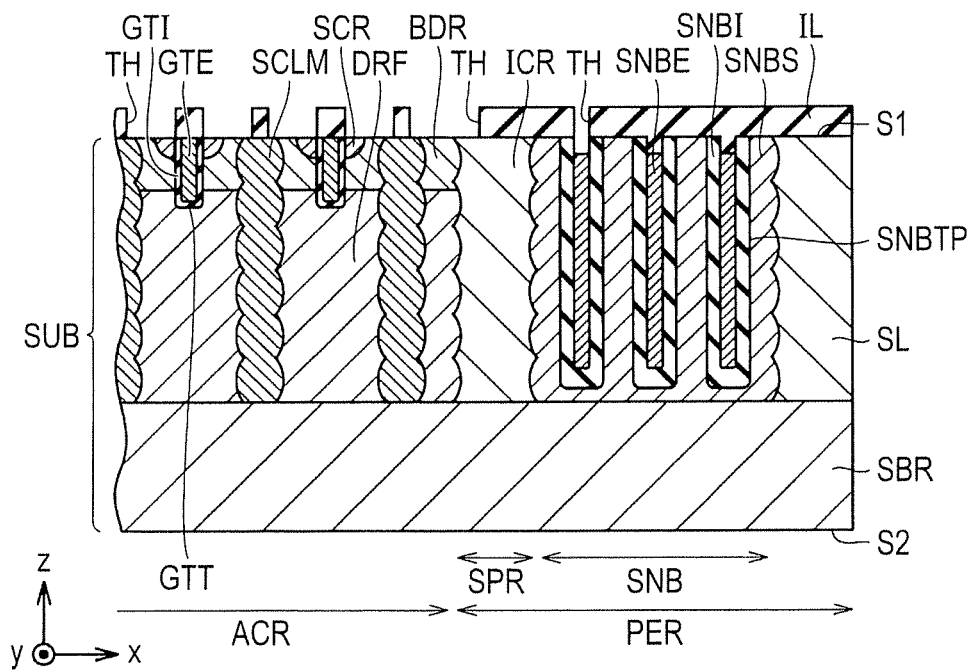
FIG. 43 is a schematic cross-sectional view showing a step, following that shown in FIG. 42, in the method of manufacturing a semiconductor device according to Third Embodiment.

Referring to FIG. 43, the method of manufacturing a semiconductor device SC3 according to the present embodiment may include forming an interlayer insulating film IL having a through-hole TH on the first main surface S1 of the semiconductor substrate SUB. The step of forming an interlayer insulating film IL according to the present embodiment shown in FIG. 43 is similar to the step of forming an interlayer insulating film IL according to Second Embodiment shown in FIG. 33. The method of manufacturing a semiconductor device SC3 according to the present embodiment includes forming a source electrode SCE on the first main surface S1 of the semiconductor substrate SUB and forming a drain electrode DRE on the second main surface S2 of the semiconductor substrate SUB. The step of forming a source electrode SCE and a drain electrode DRE according to the present embodiment is similar to the step of forming a source electrode SCE and a drain electrode DRE according to Second Embodiment. By the above-described steps, the semiconductor device SC3 of the present embodiment shown in FIG. 43 is manufactured.

The effect and advantage of the present embodiment will next be described. The present embodiment has an effect and advantage similar to those of Second Embodiment, but is different mainly in the following point.

The thickness $t_1$ of the drift layer DRF and the height $h_2$ of the semiconductor column SCLM in the semiconductor device SC3 of the present embodiment are greater than those of Second Embodiment. The insulated gate field effect transistor portion MFT of the semiconductor device SC3 of the present embodiment therefore has a withstand voltage greater than that of the insulated gate field effect transistor portion MFT of the semiconductor device SC2 of Second Embodiment.

The thickness $t_4$ of the snubber semiconductor region SNBS, the height $h_4$ of the snubber insulating film SNBI, and the height $h_5$ of the snubber electrode SNBE are greater than those of Second Embodiment, respectively. Therefore, the snubber portion SNB of the semiconductor device SC3 of the present embodiment has a snubber capacity $C_{snb}$ greater than that of the snubber portion SNB of Second Embodiment. In the semiconductor device SC3 of the present embodiment, the surge voltage at turn-off of the insulated gate field effect transistor portion MFT can be reduced further and at the same time, the insulated gate field effect transistor portion MFT can be suppressed further from being destroyed.

The thickness $t_4$ of the second conductivity type impurity-containing region IC of the semiconductor device SC3 of the present embodiment is greater than that of Second Embodiment. The semiconductor device SC3 of the present embodiment therefore has, in the second region PER, a withstand voltage greater than that of the semiconductor device SC2 of Second Embodiment.

In the method of manufacturing a semiconductor device SC3 according to the present embodiment, forming a drift layer DRF and forming a semiconductor column SCLM are repeated. The thickness $t_1$ of the drift layer DRF and the height $h_2$ of the semiconductor column SCLM in the semiconductor device SC3 manufactured by the manufacturing method of the present embodiment are therefore greater than those of the semiconductor device SC2 of Second Embodiment, respectively. By the method of manufacturing a semiconductor device SC3 according to the present embodiment, a semiconductor device SC3 having an insulated gate field effect transistor portion MFT having an improved withstand voltage can be manufactured.

In the method of manufacturing a semiconductor device SC3 according to the present embodiment, forming a snubber semiconductor region SNBS is repeated. The thickness $t_4$ of the snubber semiconductor region SNBS of the semiconductor device SC3 manufactured by the manufacturing method of the present embodiment and the height $h_4$ of the snubber insulating film SNBI and the height $h_5$ of the snubber electrode SNBE formed in the snubber semiconductor region SNBS are greater than those of Second Embodiment, respectively. The snubber portion SNB of the semiconductor device SC3 manufactured by the manufacturing method of the present embodiment has a snubber capacity $C_{snb}$ greater than that of the snubber portion SNB of the semiconductor device SC2 manufactured by the manufacturing method of Second Embodiment. The method of manufacturing a semiconductor device SC3 according to the present embodiment makes it possible to provide the semiconductor device SC3 equipped with the snubber portion SNB capable of further reducing a surge voltage at turn-off of the insulated gate field effect transistor portion MFT and further suppressing the insulated gate field effect transistor portion MFT from being destroyed.

In the method of manufacturing a semiconductor device SC3 according to the present embodiment, forming a drift layer DRF and a snubber semiconductor region SNBS and forming a semiconductor column SCLM are repeated. Semiconductor devices having various withstand voltages including the semiconductor device SC2 of Second Embodiment and the semiconductor device SC3 of Third Embodiment can be manufactured in the same manufacturing line with improved productivity.

The semiconductor device SC3 and manufacturing method thereof according to the present embodiment can be modified as in the modification example of the semiconductor device SC2 and manufacturing method thereof according to Second Embodiment.

The invention made by the present inventors has been described specifically based on some embodiments. It is needless to say that the invention is not limited to these embodiments but can be changed in various ways without departing from the gist of the invention.

What is claimed is:

1. A semiconductor device, comprising:
   a semiconductor substrate having a first main surface and a second main surface opposite to each other;
   an insulated gate field effect transistor portion placed in a first region of the semiconductor substrate; and
   a snubber portion placed in a second region of the semiconductor substrate around the first region,
   wherein the insulating gate field effect transistor portion comprises:
      a drift layer having a first conductivity type placed in the semiconductor substrate;
      a body region placed on the side of the first main surface of the drift layer in the semiconductor substrate and having a second conductivity type different from the first conductivity type;
      a source region having the first conductivity type placed on the side of the first main surface of the body region in the semiconductor substrate;
      a gate insulating film placed over a portion of the body region sandwiched between the drift layer and the source region;
      a gate electrode opposite to the portion of the body region with the gate insulating film therebetween; and
      a source electrode placed over the first main surface and electrically coupled to the source region,
   wherein the snubber portion comprises:
      a snubber semiconductor region having the first conductivity type placed in the semiconductor substrate;
      a snubber insulating film placed in a snubber trench provided on the side of the first main surface of the snubber semiconductor region;
      a snubber electrode placed in the snubber trench and opposite to the snubber semiconductor region with the snubber insulating film therebetween; and
      a snubber semiconductor column having the second conductivity type and located along the snubber insulating film in the snubber trench,
   wherein the snubber electrode is connected to the source electrode, wherein a concentration of an impurity having the first conductivity type in the snubber semiconductor region is greater than a concentration of the impurity having the first conductivity type in the drift layer, and wherein a thickness of the snubber insulating film between the snubber semiconductor region and the snubber electrode is greater than a thickness of the gate insulating film between the gate electrode and the body region.

2. The semiconductor device according to claim 1,
wherein the gate electrode and the gate insulating film are placed in a gate trench provided in the first main surface, and
wherein a height of the snubber electrode in a normal direction of the first main surface is greater than a height of the gate electrode in the normal direction of the first main surface.

3. The semiconductor device according to claim 1,
wherein the concentration of the impurity having the first conductivity type in the snubber semiconductor region is 1.5 times or more the concentration of the impurity having the first conductivity type in the drift layer.

4. The semiconductor device according to claim 1,
wherein the thickness of the snubber insulating film is 1.5 times or more the thickness of the gate insulating film.

5. The semiconductor device according to claim 1, further comprising:
in the second region, an isolation structure located between the insulated gate field effect transistor portion and the snubber portion and electrically isolating the snubber portion from the insulated gate field effect transistor portion.

6. The semiconductor device according to claim 5,
wherein the isolation structure includes a second conductivity type impurity-containing region electrically coupled to the source electrode and containing an impurity having the second conductivity type,
wherein a concentration of the impurity having the second conductivity type in the second conductivity type impurity-containing region is smaller than the concentration of the impurity having the first conductivity type in the drift layer, and
wherein a thickness of the second conductivity type impurity-containing region is equal to or greater than a thickness of the drift layer.

7. The semiconductor device according to claim 1,
wherein the insulated gate field effect transistor portion further comprises, in the drift layer, at least one semiconductor column having the second conductivity type.

8. The semiconductor device according to claim 7,
wherein the insulated gate field effect transistor portion further comprises an insulator column,
wherein the at least one semiconductor column is placed along a side wall of a column trench in the drift layer,
wherein the insulator column is placed in the column trench, and
wherein the snubber trench has a width greater than a width of the column trench.

9. The semiconductor device according to claim 7,
wherein the at least one semiconductor column is a plurality of semiconductor columns, wherein the semiconductor columns are placed along a side wall of the column trenches in the drift layer,
wherein the snubber trench has a plurality of snubber trench portions extending in parallel to each other in the first main surface, and
a distance between the snubber trench portions is smaller than a distance between the column trenches.

10. A method of manufacturing a semiconductor device, comprising the steps of:
forming an insulated gate field effect transistor portion in a first region of a semiconductor substrate having a first main surface and a second main surface opposite to each other; and
forming a snubber portion in a second region of the semiconductor substrate around the first region,
wherein the step of forming an insulated gate field effect transistor portion comprises:
forming a drift layer having a first conductivity type in the semiconductor substrate;
forming a body region placed on the side of the first main surface of the drift layer in the semiconductor substrate and having a second conductivity type different from the first conductivity type and a source region having the first conductivity type placed on the side of the first main surface of the body region in the semiconductor substrate;
forming a gate insulating film placed over a portion of the body region sandwiched between the drift layer and the source region and a gate electrode opposite to the portion of the body region with the gate insulating film therebetween; and
forming a source electrode to be electrically coupled to the source region over the first main surface,
wherein the step of forming a snubber portion comprises:
forming a snubber semiconductor region having the first conductivity type in the semiconductor substrate;
forming a snubber trench on the side of the first main surface in the snubber semiconductor region;
forming a snubber semiconductor column having the second conductivity type and located along the snubber trench;
forming a snubber insulating film in the snubber trench; and
forming, in the snubber trench, a snubber electrode opposite to the snubber semiconductor region with the snubber insulating film therebetween,
wherein forming a source electrode includes connecting the source electrode to the snubber electrode,
wherein forming a snubber semiconductor region includes forming a snubber semiconductor region so that the snubber semiconductor region has a first conductivity type impurity concentration greater than the first conductivity type impurity concentration in the drift layer, and
wherein forming a snubber insulating film includes forming a snubber insulating film so that the snubber insulating film has a thickness, between the snubber semiconductor region and the snubber electrode, greater than a thickness of the gate insulating film between the gate electrode and the body region.

* * * * *